US011363224B2

United States Patent
Jang et al.

(10) Patent No.: US 11,363,224 B2
(45) Date of Patent: Jun. 14, 2022

(54) IMAGE SENSING DEVICE

(71) Applicant: SK hynix Inc., Icheon-si (KR)

(72) Inventors: Jae Hyung Jang, Icheon-si (KR); Jong Chae Kim, Icheon-si (KR); Hyung June Yoon, Icheon-si (KR); Hoon Moo Choi, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 17/175,633

(22) Filed: Feb. 13, 2021

(65) Prior Publication Data

US 2021/0368122 A1    Nov. 25, 2021

(30) Foreign Application Priority Data

May 25, 2020   (KR) .................. 10-2020-0062199

(51) Int. Cl.
| | |
|---|---|
| *H04N 5/374* | (2011.01) |
| *H04N 5/351* | (2011.01) |
| *G01S 17/89* | (2020.01) |
| *G01S 7/48* | (2006.01) |
| *H01L 27/146* | (2006.01) |
| *H04N 5/3745* | (2011.01) |
| *G01S 17/894* | (2020.01) |

(52) U.S. Cl.
CPC ......... *H04N 5/3745* (2013.01); *G01S 17/894* (2020.01); *H04N 5/351* (2013.01)

(58) Field of Classification Search
CPC ...... H04N 5/374; H04N 5/351; G01S 17/894; G01S 7/4816; H01L 27/14612; H01L 27/14643
See application file for complete search history.

(56) References Cited

U.S. PATENT DOCUMENTS

| | | | | |
|---|---|---|---|---|
| 11,218,657 | B2* | 1/2022 | Jang | ........................ H04N 5/374 |
| 2019/0252449 | A1* | 8/2019 | Ebiko | .............. H01L 27/14643 |
| 2019/0342510 | A1* | 11/2019 | Sano | ..................... H04N 5/351 |
| 2020/0029047 | A1* | 1/2020 | Jin | ....................... H04N 5/3745 |
| 2021/0288088 | A1* | 9/2021 | Jang | ................. H01L 27/14612 |
| 2021/0320140 | A1* | 10/2021 | Kitano et al. | ..... H01L 27/14605 |
| 2021/0400223 | A1* | 12/2021 | Kitano | .................. H04N 5/378 |
| 2021/0408094 | A1* | 12/2021 | Jang | ................. H01L 27/01463 |

FOREIGN PATENT DOCUMENTS

| | | |
|---|---|---|
| JP | 2018-117117 A | 7/2018 |
| KR | 10-2019-0088457 A | 7/2019 |

OTHER PUBLICATIONS

Cho, J. et al., "A 3-D Camera With Adaptable Background Light Suppression Using Pixel-Binning and Super-Resolution." IEEE Journal of Solid-State Circuits, vol. 49, No. 10, Oct. 2014, pp. 2319-2332.
Hansard, M. et al., "Time of Flight Cameras: Principles, Methods, and Applications." Springer Briefs in Computer Science, 2012, 103 pages.

* cited by examiner

*Primary Examiner* — Marly S Camargo
(74) *Attorney, Agent, or Firm* — Perkins Coie LLP

(57) ABSTRACT

An image sensing device may include a first tap and a second tap configured to generate a hole current in a substrate, and capture photocharge which is generated by incident light and migrated by the hole current. The first and second taps may be disposed in vertex regions facing each other in a diagonal direction in one pixel, respectively.

19 Claims, 27 Drawing Sheets

IMAGE SENSING DEVICE

CROSS-REFERENCES TO RELATED APPLICATION

This patent document claims the priority and benefits of Korean application number 10-2020-0062199, filed on May 25, 2020, the disclosure of which is incorporated herein by reference in its entirety as part of this patent document.

TECHNICAL FIELD

The technology and implementations disclosed in this patent document generally relate to an image sensor for sensing a distance from a target object.

BACKGROUND

An image sensor is used in electronic devices to capture optical images by converting light into electrical signals using a semiconductor material that react to light. With the recent development of automotive, medical, computer and communication industries, the demand for high-performance image sensor has been increasing in various electronic devices such as a smart phone, digital camera, game machine, IOT (Internet of Things), robot, security camera and medical micro camera.

Image sensors may be roughly classified into CCD (Charge Coupled Device) image sensors and a CMOS (Complementary Metal Oxide Semiconductor) image sensors. CCD image sensor create high-quality, low-noise images, and traditionally have advantages over the CMOS image sensor in terms of noise characteristics. However, CMOS image sensors are now widely used due to certain advantages over the CCD counterparts, including, e.g., higher frame rates and shutter speed. In addition, CMOS image sensors and signal processing circuitry can be integrated into a single chip, making it possible to miniaturize electronic devices while achieving lower power consumption. Furthermore, using the CMOS fabrication technology can result in reduction in the production costs. Such characteristics of the CMOS image sensors better suited for implementations in mobile devices.

Technologies of measuring a depth (e.g., a distance to a target object) using an image sensor have been being developed through much research, and demand for the technologies of measuring the depth have been increasing in various devices such as security devices, medical devices, vehicles, game machines, virtual reality (VR)/augmented reality AR devices, and mobile device. Examples of methods of measuring a depth may include triangulation, ToF (Time of Flight) and interferometry. Among the above-mentioned depth measurement methods, the time of flight (ToF) method becomes popular because of its wide range of utilization, high processing speed, and cost advantages. The TOF method measures a distance using emitted light and reflected light. The ToF method may be roughly classified into a direct method and an indirect method, depending on whether it is a round-trip time or the phase difference that determines the distance. The direct method may measure a distance by calculating a round trip time and the indirect method may measure a distance using a phase difference. Since the direct method is suitable for measuring a long distance, the direct method is widely used in automobiles. The indirect method is suitable for measuring a short distance and thus widely used in various higher-speed devices designed to operate at a higher speed, for example, game consoles or mobile cameras. As compared to the direct type TOF systems, the indirect method has several advantages including having a simpler circuitry, low memory requirement, and a relatively lower cost.

A CAPD (Current-Assisted Photonic Demodulator) method is one type of pixel circuitry used in an indirect TOF sensor. In CAPD, electrons are generated in a pixel circuit by a majority current that is created through an application of a substrate voltage, and the generated electrons are detected by using a potential difference between electric fields. Since the majority current is used, the CAPD can rapidly detect electrons. In addition, the CAPD has an excellent efficiency by detecting some electrons formed at a deep depth.

SUMMARY

Various embodiments are directed to an image sensing device including pixels each having a structure optimized to miniaturization.

In one aspect, an image sensing device is provided to include a first tap and a second tap configured to generate a hole current in a substrate, and capture photocharge which is generated by incident light and migrated by the hole current. The first and second taps may be disposed in vertex regions facing each other in a diagonal direction in one pixel, respectively.

In another aspect, an image sensing device is provided to include: a pixel array including pixels, each pixel structured to respond to incident light to produce photocharges indicative of detected incident light, wherein the pixel array includes: a first detection structure and a second detection structure located at vertex regions of the pixel on two opposite sides of the pixel in a diagonal direction of the pixel and configured to receive photocharges generated by the pixel in response to incident light and are carried by a current.

In another aspect, an image sensing device is provided to include: a control node disposed in the center of pixels arranged in a 2×2 matrix, and configured to generate a hole current in a substrate; and a plurality of detection nodes disposed in the respective pixels, and configured to capture photocharge generated by incident light and migrated by the hole current.

In another aspect, an image sensing device is provided to include: pixels disposed in a substrate and arranged in a 2×2 matrix as a unit, each pixel structured to respond to incident light to produce photocharges indicative of detected incident light; a control node disposed in a center of the pixels and configured to receive a control signal for generating a current in the substrate; and a plurality of detection nodes disposed in the respective pixels, and configured to receive photocharges generated by the pixels in response to incident light and carried by the current.

In accordance with some embodiments of the disclosed technology, as the pixels arranged in a 2×2 matrix shares the control node without independently including the control node, the distance between the control nodes in a random pixel can be increased to the maximum, which makes it possible to minimize power required for generating a hole current.

In addition, it is possible to provide various effects which can be directly or indirectly determined through this document.

DETAILED DESCRIPTION

Hereafter, various embodiments will be described with reference to the accompanying drawings. However, it should be understood that the disclosed technology is not limited to specific embodiments, but includes various modifications, equivalents and/or alternatives of the embodiments.

Figure 1:
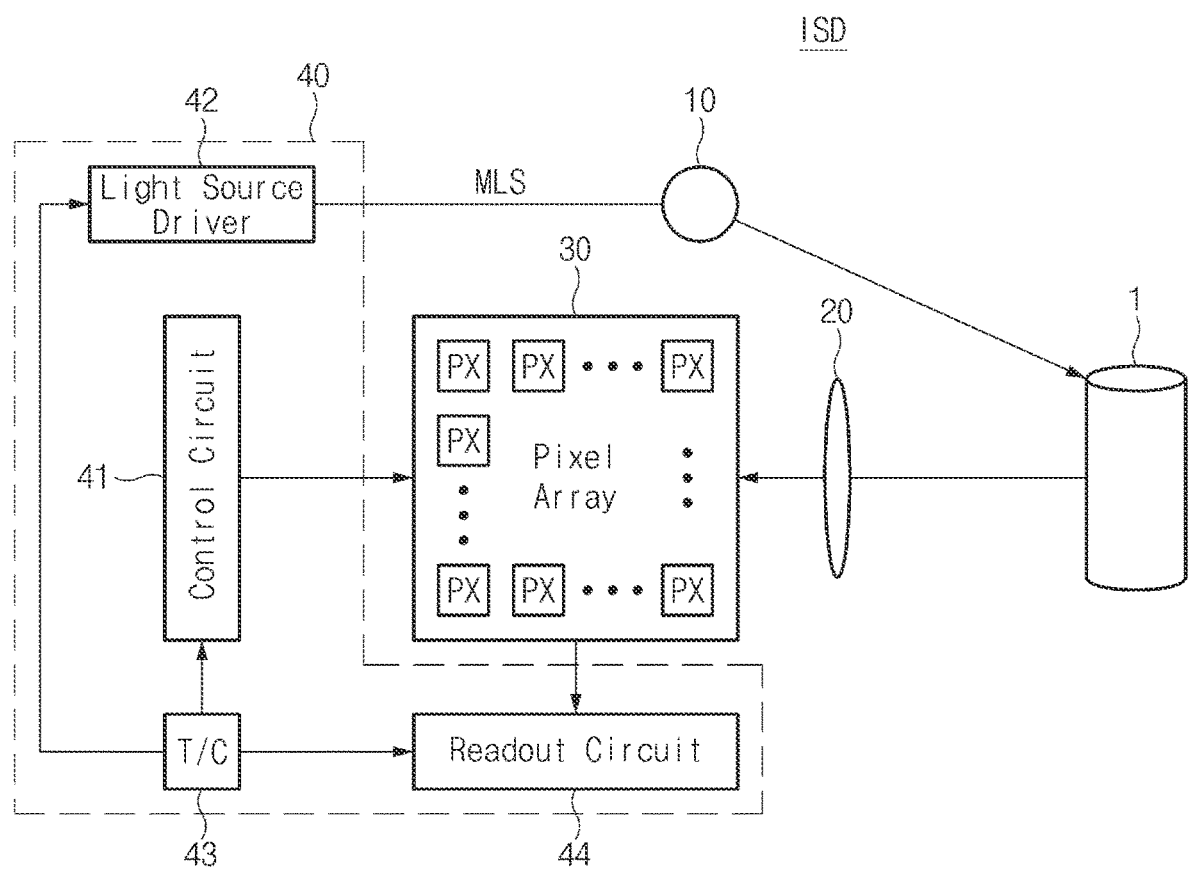
FIG. 1 is a configuration diagram schematically illustrating a configuration of an image sensing device in accordance with embodiments.

FIG. 1 is a configuration diagram schematically illustrating a configuration of an image sensing device in accordance with embodiments.

Referring to FIG. 1, the image sensing device ISD may measure a distance from a target object 1 using a TOF (Time Of Flight) method. Such an image sensing device ISD may include a light source 10, a lens module 20, a pixel array 30 and a control block 40.

The light source 10 emits light onto the target object 1 in response to a light modulation signal MLS (modulated light signal) from the control block 40. The light source 10 may be an LD (laser Diode) or LED (Light Emitting Diode) which emits a specific wavelength of light (for example, near-infrared light, infrared light or visible light), NIR (Near Infrared Laser), a point light source, a white lamp, a monochromatic light source having monochromators combined therein, or a combination of other laser light sources. For example, the light source 10 may emit infrared light having a wavelength of 800 nm to 1,000 nm. The light emitted from the light source 10 may be light modulated at a predetermined frequency. FIG. 1 illustrates only one light source 10, for convenience of description. However, a plurality of light sources may be arranged around the lens module 20.

The lens module 20 may collect light reflected from the target object 1 and focus the collected light on pixels PX of the pixel array 30. For example, the lens module 20 may include a focusing lens with a glass or plastic surface or another cylindrical optical element. The lens module 20 may include a plurality of lenses aligned with an optical axis.

The pixel array 30 may include a plurality of unit pixels PX which are successively arranged in a 2D matrix structure, for example, a plurality of unit pixels PX which are successively arranged in column and row directions. The unit pixels PX may be formed on a semiconductor substrate, and each of the unit pixels PX may convert light, incident through the lens module 20, into an electrical signal corresponding to the intensity of the light, and output the electrical signal as a pixel signal. At this time, the pixel signal may be a signal which does not indicate the color of the target object 1, but indicates the distance to the target object 1. Each of the unit pixels PX may be a CAPD (Current-Assisted Photonic Demodulator) pixel. The detailed structure and operation of each unit pixel PX will be described below with reference to FIG. 2 and the followings.

The control block 40 may control the light source 10 to emit light onto the target object 1, and drive the unit pixels PX of the pixel array 30 to process pixel signals corresponding to light reflected from the target object 1, thereby measuring the distance to the surface of the target object 1.

The control block 40 may include a control circuit 41, a light source driver 42, a timing controller 43 and a readout circuit 44.

The control circuit 41 may drive the unit pixels PX of the pixel array 30 in response to a timing signal outputted from the timing controller 43. For example, the control circuit 41 may generate a control signal capable of selecting and controlling one or more row lines among a plurality of row lines. Such a control signal may include a demodulation control signal for generating a hole current within a substrate, a reset signal for controlling a reset transistor, a transmission signal for controlling transfer of photocharge accumulated in a detection node, a floating diffusion signal for providing additional capacitance under a high luminance condition, and a selection signal for controlling a selection transistor. FIG. 1 illustrates that the control circuit 41 is disposed in the column direction (or vertical direction) of the pixel array 30. According to an embodiment, however, at least a part of the control circuit 41 (for example, a circuit for generating the demodulation control signal) may be disposed in the row direction (or horizontal direction) of the pixel array 30.

The light source driver 42 may generate the light modulation signal MLS capable of driving the light source 10, under control of the timing controller 43. The light modulation signal MLS may be a signal modulated at a predetermined frequency.

The timing controller 43 may generate a timing signal for controlling the operations of the control circuit 41, the light source driver 42 and the readout circuit 44.

The readout circuit 44 may generate pixel data in the form of digital signals by processing pixel signals outputted from the pixel array 30, under control of the timing controller 43. For this operation, the readout circuit 44 may include a CDS (Correlated Double Sampler) for performing correlated double sampling on the pixel signals outputted from the pixel array 30. The readout circuit 44 may include an analog-digital converter for converting the output signals from the CDS into digital signals. Furthermore, the readout circuit 44 may include a buffer circuit which temporarily stores pixel data outputted from the analog-digital converter and outputs the pixel data to the outside under control of the timing controller 43. As the pixel array 30 is composed of CAPD pixels, two column lines per column of the pixel array 30 may be provided to transfer pixel signals, and components for processing pixel signals outputted from the column lines may also be provided for the respective column lines.

The light source 10 may emit light, modulated at a predetermined frequency, toward a scene captured by the image sensing device ISD, and the image sensing device ISD may sense the modulated light (i.e. incident light) reflecting from target objects 1 within the scene, and generate depth information for each of the unit pixels PX. Between the modulated light and the incident light, time delay is present according to the distance between the image sensing device ISD and the target object 1. Such time delay appears as a phase difference between a signal generated by the image sensing device ISD and the light modulation signal MLS for controlling the light source 10. An image processor (not illustrate) may generate a depth image containing depth information for each of the unit pixels PX by computing a phase difference which appears in a signal outputted from the image sensing device ISD.

Figure 2:
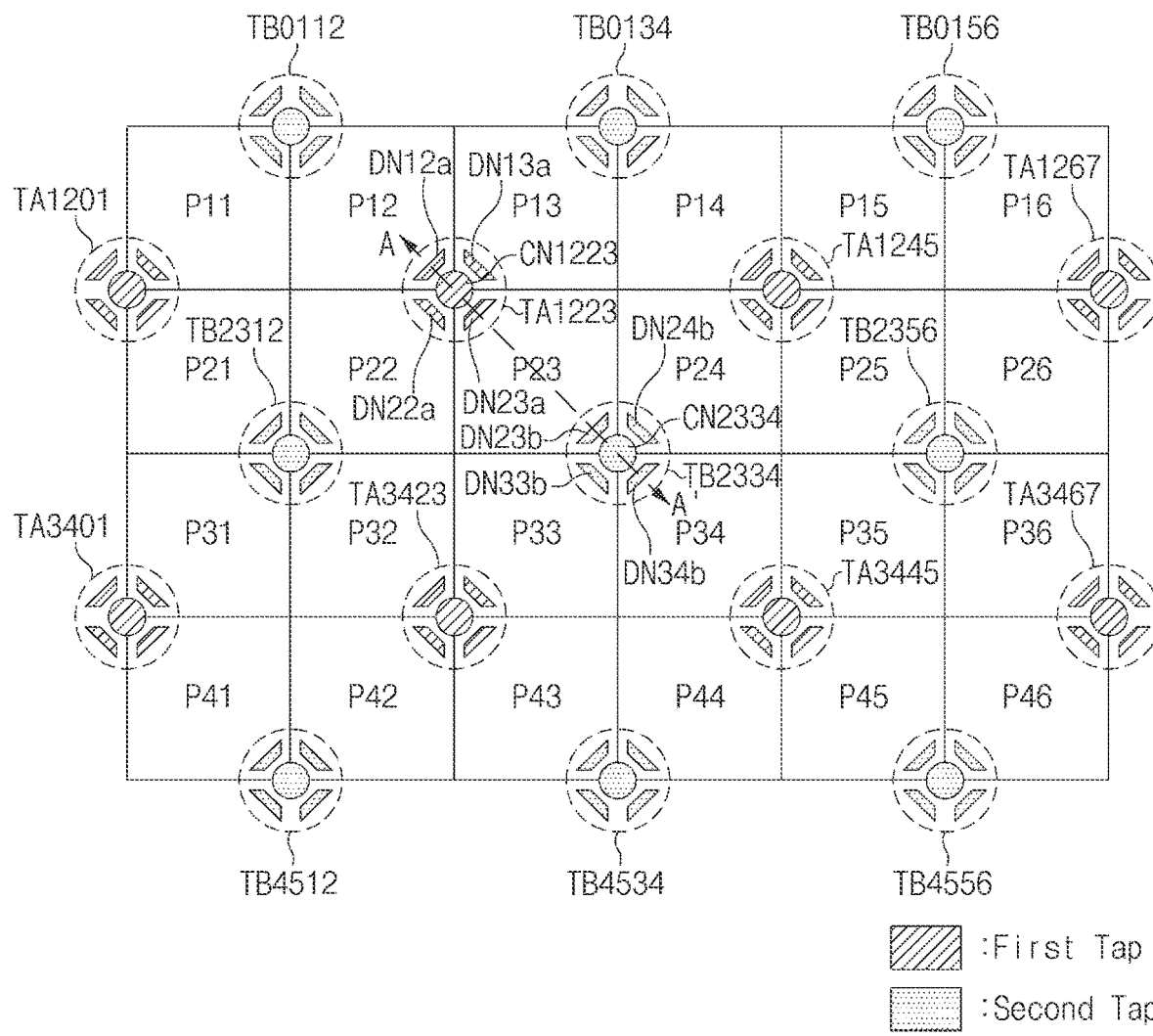
FIG. 2 is a diagram illustrating an example of a pixel array of FIG. 1.

FIG. 2 is a diagram briefly illustrating an example of the pixel array of FIG. 1.

FIG. 2 illustrates an example of the pixel array 30. For convenience of description, FIG. 2 illustrates 24 pixels arranged in a matrix shape including four rows and six columns. However, the number of pixels included in the pixel array 30 can be modified.

The pixel array 30 includes the pixels represented by Pnm, where n indicates a row in which a corresponding pixel is included, and m indicates a column in which the corresponding pixel is included. For example, a pixel P23 indicates a pixel belonging to the second row and the third column. The row and column that are located above the first row and on a left side of the first column, respectively, are defined as zeroth row and zeroth column. The row and column that are located below the fourth row and on a right side of the sixth column, respectively, are defined as fifth row and seventh column, respectively.

The pixel array 30 may include first taps (for example, TA1201) and second taps (for example, TB0112) which are regularly arranged. Each tap is a detection structure that includes a control node configured to receive a control signal and a plurality of detection nodes disposed adjacent to the control node to collect and detect photocharges.

Each of the first and second taps may be disposed in the center of four pixels arranged in a 2×2 pixel matrix. For example, referring to FIG. 2, a first tap TA1223 may be disposed in the center of a 2×2 pixel matrix including pixels P12, P13, P22 and P23, and a second tap TB2334 may be disposed in the center of a 2×2 matrix including pixels P23, P24, P33 and P34. The first or second tap may be defined as Txy, where x may indicate the type of the tap (for example, the first tap is A or the second tap is B), and y may indicate the location of the tap (for example, TA1223 is disposed in the center of a 2×2 matrix including the pixels P12, P13, P22 and P23 corresponding to an intersection of pixels belonging to the first and second rows and pixels belonging to the second and third columns). In the present disclosure, when a component is disposed in the center of four pixels, it may include not only the case in which the center of the corresponding component (for example, the first tap) coincides with the center of the four pixels, but also the case in which a part of the corresponding component overlaps the four pixels.

A pixel included in the pixel array 30 may have a rectangular shape, and include four vertex regions at the left top, right top, left bottom and right bottom thereof. In the present disclosure, the vertex regions located at the left top, right top, left bottom and right bottom of each pixel are defined as a first vertex region, a second vertex region, a third vertex region and a fourth vertex region, respectively. In the present disclosure, each of the vertex regions may indicate a region including the corresponding vertex of the pixel.

In each of the pixels, the first and second taps may be disposed in two vertex regions that face each other in a diagonal direction (for example, the first and fourth vertex regions or the second and third vertex regions). The diagonal direction connecting the first and fourth vertex regions is defined as a first diagonal direction, and the diagonal direction connecting the second and third vertex regions is defined as a second diagonal direction. When the first and second taps are disposed in the first diagonal direction in one pixel, the first and second taps may be disposed in the second diagonal direction in pixels adjacent to the pixel, the adjacent pixels located on the top, bottom, left or right sides of the pixel.

On the pixel array 30, the first taps and the second taps may be alternately disposed in the first diagonal direction or the second diagonal direction. For example, based on the first tap TA1223, a second tap TB2334, a first tap TA3445 and a second tap TB4556 may be alternately disposed in the first diagonal direction.

In the pixel array 30, the first or second tap may not be disposed in each of the successive vertex regions but sparsely disposed in the row direction (or horizontal direction) or the column direction (or vertical direction). The first taps are arranged along the row direction or the column direction at vertex regions that are not consecutive in the row direction or the column direction. The second taps are arranged along the row direction or the column direction at vertex regions that are not consecutive in the row direction or the column direction. Thus, the vertex region in which the first or second tap is disposed in the row direction (or horizontal direction) or the column direction (or vertical direction) and the vertex region in which the first and second taps are not disposed may be alternately disposed.

The first or second tap may include a control node and detection nodes surrounding the control node. The detection nodes are adjacent to the control node. FIG. 2 illustrates that the control node has a circular shape, and the detection nodes each have a trapezoidal shape. However, the present embodiment is not limited thereto. Various embodiments of the control node and the detection node will be described below with reference to FIGS. 16A to 16F. In FIG. 2, each of the detection nodes may have a trapezoidal shape in which a first side adjacent to the corresponding control node is shorter than a second side that is opposite to the first side. This trapezoidal shape of each detection node allows to surround a corresponding control node in an area that is as wide as possible, to more easily capture a signal carrier which migrates along a hole current formed by the control node.

The control node may be disposed in the center of four pixels constituting a 2×2 matrix (or the vertex regions of each of the pixels), and the detection nodes may be disposed to face each other in the first or second diagonal direction around the control node. Each of the detection nodes may be disposed so as to be included in each of the four pixels adjacent to the control node. For example, a control node CN2334 of the second tap TB2334 may be disposed in the center of a 2×2 matrix including the pixels P23, P24, P33 and P34, and detection nodes DN23b, DN24b, DN33b and DN34b may be included in the pixels P23, P24, P33 and P34, respectively.

The different control nodes receive different voltages. The hole current flowing between the different control nodes increases as the potential difference between the control nodes is increased, the distance between the control nodes is decreased, and/or the areas of surfaces of the control nodes that face each other are increased. The hole current flowing between the different control nodes decreases as the potential difference between the control nodes is decreased, the distance between the control nodes is increased, and/or the areas of surfaces of the control nodes that face each other are decreased. Thus, the hole current may be decided by the potential difference between the control nodes and the resistance between the control nodes. The resistance between the control nodes increases as the distance between the control nodes is increased and the areas of the surfaces of the control nodes that facing each other are decreased.

In accordance with the present embodiment, the pixels arranged in a 2×2 matrix may share the control node, and independently include the detection nodes. For example, the pixels P23, P24, P33, P34 arranged in a 2×2 matrix share the control node disposed at the center of the 2×2 matrix and include the respective detection nodes DN23b, DN24b, DN33b, DN34b, respectively. As the pixels arranged in the 2×2 matrix does not independently include the control node while sharing the control node, the distance between the control nodes within a pixel can be increased as much as possible. Therefore, the magnitude of the hole current can be reduced.

As the pixels arranged in the 2×2 matrix share the control node, the number of control nodes required by the pixel array 30 is decreased to ¼ in comparison to the case in which each of the pixels independently includes the control node. This configuration can significantly reduce a load to which the control circuit 41 needs to apply a voltage, and considerably reduce power consumption of the image sensing device.

In the disclosed technology, the control node and the detection node which are included in the first tap are defined as a first control node and a first detection node, respectively, and the control node and the detection node which are included in the second tap are defined as a second control node and a second detection node, respectively.

The structure and operation of each of the pixels will be described with reference to FIG. 3 which is a cross-sectional view of the pixel array 30, taken along a first cutting line A-A' illustrated in FIG. 2.

Figure 3:
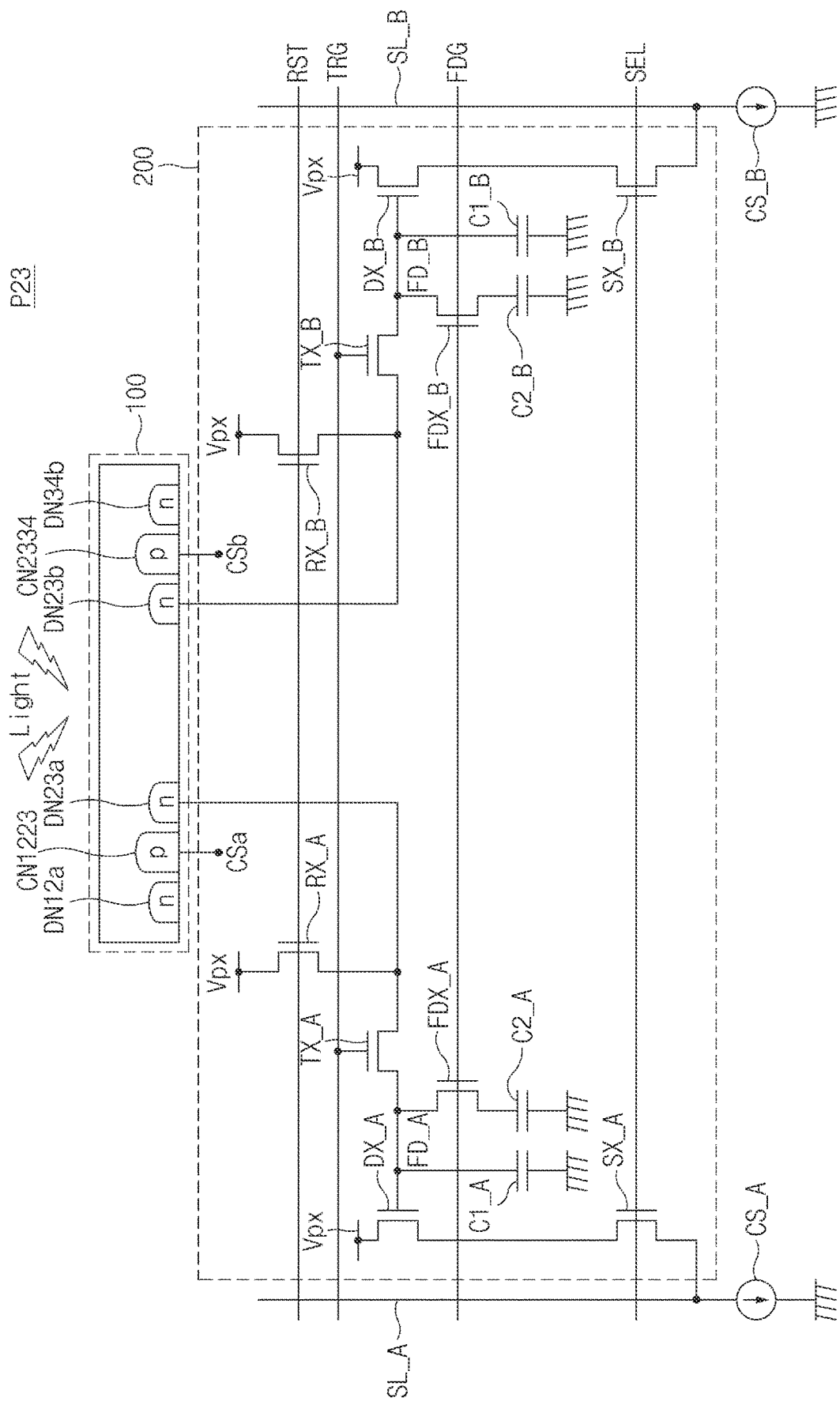
FIG. 3 is a diagram illustrating an embodiment of a pixel included in the pixel array illustrated in FIG. 2.

FIG. 3 is a diagram illustrating an embodiment of a pixel included in the pixel array illustrated in FIG. 2.

Referring to FIG. 3, a pixel P23 may include a photo-electric conversion region 100 and a circuit region 200. In FIG. 3, the pixel P23 is taken as an example for description. Other pixels included in the pixel array 30 may have substantially the same structure as the pixel P23 and operate in substantially the same manner as the pixel P23.

The photo-electric conversion region 100 corresponds to a cross-section of the pixel array 30, taken along the first cutting line A-A' of FIG. 2.

The photo-electric conversion region 100 may include first and second control nodes CN1223 and CN2334 and first and second detection nodes DN12a, DN23a, DN23b and DN34b. The first control node CN1223 and the first detection nodes DN12a and DN23a may constitute a first tap (or first demodulation node), and the second control node CN2334 and the second detection nodes DN23b and DN34b may constitute a second tap (or second demodulation node). Since the first detection node DN12a and the second detection node DN34b have no direct relevance to the operation of the pixel P23, the detailed descriptions thereof will be omitted herein.

The first and second control nodes CN1223 and CN2334 and the first and second detection nodes DN23a and DN23b may be formed in a substrate. For example, the substrate may be a P-type semiconductor substrate, the first and second control nodes CN1223 and CN2334 may be or include P-type impurity regions, and the first and second detection nodes DN23a and DN23b may be or include N-type impurity regions.

According to an embodiment, the first and second control nodes CN1223 and CN2334 may include P-type impurity regions having different doping concentrations. For example, a P-type impurity region (P− region) having a relatively low doping concentration may be implanted into the substrate so as to have a first depth, and a P-type impurity region (P+ region) having a relatively high doping concentration may be implanted into the substrate at the same location so as to have a second depth, where the first depth may be larger than the second depth. The first and second detection nodes DN23a and DN23b may include N-type impurity regions having different doping concentrations. For example, an N-type impurity region (N− region) having a relatively low doping concentration may be implanted into the substrate so as to have a third depth, and an N-type impurity region (N+ region) having a relatively high doping concentration may be implanted into the substrate at the same location so as to have a fourth depth, where the third depth may be larger than the fourth depth. Furthermore, the first depth may be larger than the third depth.

First and second control nodes CN1223 and CN2334 and the first and second detection nodes DN23a and DN23b may be physically isolated from each other.

The first and second control nodes CN1223 and CN2334 may receive first and second demodulation control signals CSa and CSb from the control circuit 41, respectively. A potential difference between the first and second demodulation control signals CSa and CSb generates an electric field (or hole current) to control a flow of signal carriers generated in the substrate by incident light.

Each of the first and second detection nodes DN23a and DN23b may function to capture and accumulate signal carriers.

The circuit region 200 may include a plurality of elements which process photocharge captured by the first and second detection nodes DN23a and DN23b, and convert the photocharge into an electrical signal. Control signals RST, TRG, FDG and SEL supplied to the plurality of elements may be supplied from the control circuit 41. Furthermore, a pixel voltage Vpx may be a supply voltage VDD or source voltage VSS.

First, the elements for processing photocharge captured by the first detection node DN23a will be described. The circuit region 200 may include a reset transistor RX_A, a transmission transistor TX_A, a first capacitor C1_A, a second capacitor C2_A, a floating diffusion transistor FDX_A, a drive transistor DX_A and a selection transistor SX_A.

The reset transistor RX_A may be activated in response to a logic high level of the reset signal RST supplied to a gate electrode thereof, and thus reset the potentials of a floating diffusion node FD_A and the first detection node DN23a to a predetermined level (i.e. pixel voltage Vpx). Furthermore, when the reset transistor RX_A is activated, the transmission transistor TX_A may be simultaneously activated to reset the floating diffusion node FD_A.

The transmission transistor TX_A may be activated in response to a logic high level of the transmission signal TRG supplied to a gate electrode thereof, and thus transmit charge stored in the first detection node DN23a to the floating diffusion node FD_A.

The first capacitor C1_A may be coupled to the floating diffusion node FD_A, and provide predetermined capacitance.

The second capacitor C2_A may be selectively coupled to the floating diffusion node FD_A according to the operation of the floating diffusion transistor FDX_A, and provide additional predetermined capacitance.

Each of the first and second capacitors C1_A and C2_A may be configured as at least one of a MIM (Metal-Insulator-Metal) capacitor, MIP (Metal-Insulator-Polysilicon) capacitor, MOS (Metal-Oxide-Semiconductor) capacitor and junction capacitor.

The floating diffusion transistor FDX_A may be activated in response to a logic high level of the floating diffusion signal FDG supplied to a gate electrode thereof, and couple the second capacitor C2_A to the floating diffusion node FD_A.

Under a high luminance condition in which the luminous intensity of incident light is relatively high, the control circuit 41 may activate the floating diffusion transistor FDX_A to couple the floating diffusion node FD_A to the second capacitor C2_A. Thus, under a high luminance condition, the floating diffusion node FD_A can accumulate more photocharges, thereby securing a high dynamic range.

Under a low luminance condition in which the luminous intensity of incident light is relatively low, the control circuit 41 may deactivate the floating diffusion transistor FDX_A to isolate the floating diffusion node FD_A from the second capacitor C2_A.

According to another embodiment, the floating diffusion transistor FDX_A and the second capacitor C2_A may be omitted.

As a drain electrode of the drive transistor DX_A is coupled to the pixel voltage Vpx and a source electrode of the drive transistor DX_A is coupled to a vertical signal line SL_A through the selection transistor SX_A, the drive transistor DX_A may constitute a source follower circuit with a load MOS of a current source circuit CS_A coupled to one end of the vertical signal line SL_A. That is, the drive transistor DX_A may output a current, corresponding to the potential of the floating diffusion node FD_A coupled to a gate electrode thereof, to the vertical signal line SL_A through the selection transistor SX_A.

The selection transistor SX_A may be activated in response to a logic high level of the selection signal SEL supplied to a gate electrode thereof, and thus output a pixel signal outputted from the drive transistor DX_A to the vertical signal line SL_A.

In order to process photocharge captured by the second detection node DN23b, the circuit region 200 may include a reset transistor RX_B, a transmission transistor TX_B, a first capacitor C1_B, a second capacitor C2_B, a floating diffusion transistor FDX_B, a drive transistor DX_B and a selection transistor SX_B. The elements for processing the photocharge captured by the second detection node DN23b are configured and operated in the same manner as the above-described elements for processing the photocharge captured by the first detection node DN23a, except operation timings. Thus, the overlapping descriptions will be omitted herein.

Pixel signals outputted to the vertical signal lines SL_A and SL_B from the circuit region 200 may be converted into image data through a noise removal operation and an analog-digital conversion operation.

FIG. 3 illustrates that each of the reset signal RST, the transmission signal TRG, the floating diffusion signal FDG and the selection signal SEL is supplied through one signal line. However, each of the reset signal RST, the transmission signal TRG, the floating diffusion signal FDG and the selection signal SEL may be supplied through a plurality of signal lines (for example, two signal lines), such that the elements for processing the photocharge captured by the first detection node DN23a and the elements for processing the photocharge captured by the second detection node DN23b are operated at different timings.

The image processor (not illustrated) may calculate a phase difference by performing an operation on image data acquired from the photocharge captured by the first detection node DN23a and image data acquired from the photocharge captured by the second detection node DN23b, calculate depth information, indicating the distance to the target object 1, from a phase difference corresponding to each of the pixels, and generate a depth image including the depth information corresponding to each of the pixels.

Figure 4:
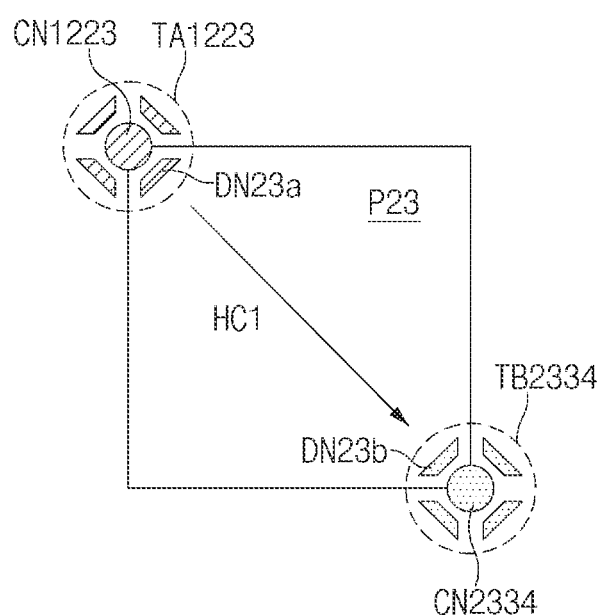
FIGS. 4 and 5 are diagrams for describing an operation of an image sensing device which operates in a first mode.
Figure 5:
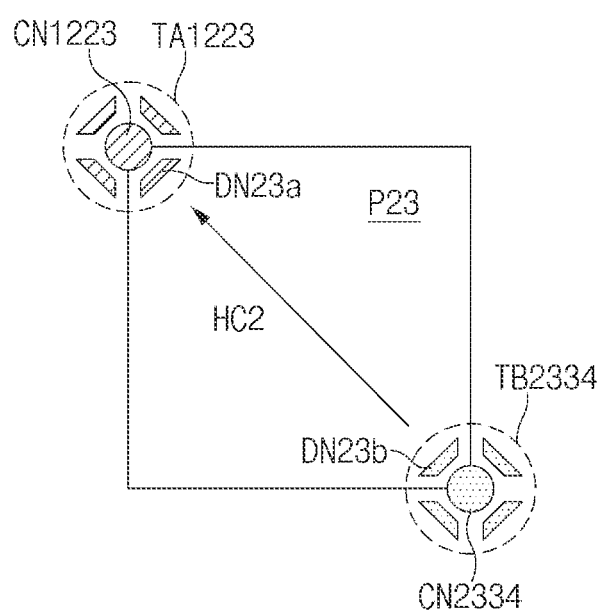

FIGS. 4 and 5 are diagrams for describing an operation of the image sensing device which operates in a first mode.

Referring to FIG. 4, the image sensing device ISD may operate in two operation modes, i.e. the first mode and a second mode.

The first mode may indicate a mode in which the operation of the image sensing device ISD to capture photocharge of the photo-electric conversion region 100 is performed in periods divided into a first period and a second period. The second mode may indicate a mode in which the operation of the image sensing device ISD to capture photocharge is performed in periods divided into first to fourth periods. The first mode may indicate a 2-phase modulation method, and the second mode may indicate a 4-phase modulation mode.

The detailed operations of the first mode will be described with reference to FIGS. 4, 5, 6A and 6B, and the detailed operations of the second mode will be described with reference to FIGS. 7 to 10, 11A and 11B. In the following descriptions, the pixel P23 or a pixel group including the pixel P23 will be taken as an example. However, the operations may be applied in substantially the same manner to other pixels within the pixel array 30.

The image sensing device ISD may be set to operate in any one of the first and second modes as a default mode. According to another embodiment, the image processor (not illustrated) for controlling the image sensing device ISD may decide the operation mode of the image sensing device ISD according to a request of a user or a system, and transfer a signal corresponding to the decided operation mode to the timing controller 43, thereby controlling the image sensing device ISD to operate in the corresponding operation mode.

In the first mode, the capturing of the photocharges by the photo-electric conversion region 100 may be performed over the first and second periods which are sequential time periods.

In the first period, incident light incident into the pixel P23 may be photo-electrically converted according to a photo-electric effect, and thus generate an electron-hole pair corresponding to the intensity of the incident light. In the present embodiment, the electron generated in response to the intensity of the incident light may indicate photocharges. At this time, the control circuit 41 may apply the first demodulation control signal CSa to the first control node CN1223, and apply the second demodulation control signal CSb to the second control node CN2334. Here, the first demodulation control signal CSa may have a higher voltage than the second demodulation control signal CSb. At this time, the voltage of the first demodulation control signal CSa may be defined as an active voltage, and the voltage of the second demodulation control signal CSb may be defined as an inactive voltage. For example, the voltage of the first demodulation control signal CSa may be 1.2V, and the voltage of the second demodulation control signal CSb may be 0V.

A voltage difference between the first and second demodulation control signals CSa and CSb may generate an electric field between the first and second control nodes CN1223 and CN2334, and a hole current HC1 may flow from the first control node CN1223 to the second control node CN2334. Holes within the substrate migrate toward the second control node CN2334, and electrons within the substrate migrate toward the first control node CN1223.

Electrons may be generated in the substrate in response to the luminous intensity of incident light, and migrate toward the first control node CN1223 so as to be captured by the first detection node DN23*a* adjacent to the first control node CN1223. Therefore, the electrons within the substrate may be used as signal carriers for detecting the luminous intensity of the incident light.

Referring to FIG. 5, in the second period succeeding the first period, incident light incident into the pixel P23 may be photo-electrically converted according to the photo-electric effect, and thus generate an electron-hole pair corresponding to the intensity of the incident light. At this time, the control circuit 41 may apply the first demodulation control signal CSa to the first control node CN1223, and apply the second demodulation control signal CSb to the second control node CN2334. Here, the first demodulation control signal CSa may have a lower voltage than the second demodulation control signal CSb. At this time, the voltage of the first demodulation control signal CSa may be defined as an inactive voltage, and the voltage of the second demodulation control signal CSb may be defined as an active voltage. For example, the voltage of the first demodulation control signal CSa may be 0V, and the voltage of the second demodulation control signal CSb may be 1.2V.

A voltage difference between the first and second demodulation control signals CSa and CSb may generate an electric field between the first and second control nodes CN1223 and CN2334, and a hole current HC2 may flow from the second control node CN2334 to the first control node CN1223. Thus, holes within the substrate migrate toward the first control node CN1223, and electrons within the substrate migrate toward the second control node CN2334.

Electrons may be generated in the substrate in response to the luminous intensity of incident light, and migrate toward the second control node CN2334 so as to be captured by the second detection node DN23*b* adjacent to the second control node CN2334. Therefore, the electrons within the substrate may be used as signal carriers for detecting the luminous intensity of the incident light.

Figure 6A:
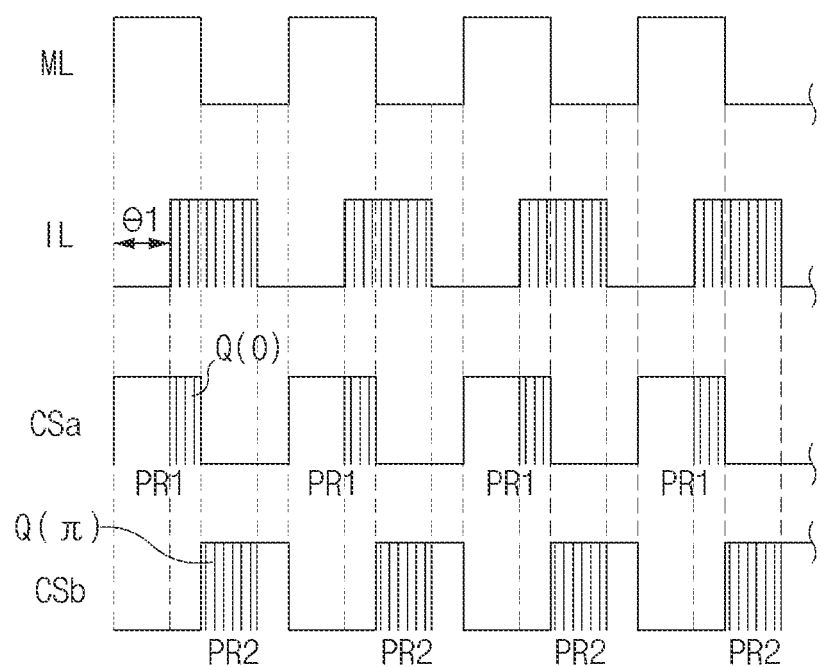
FIG. 6A is an example of a timing diagram for describing an operation of an image sensing device which operates in the first mode.

FIG. 6A is a timing diagram for describing an operation of the image sensing device which operates in the first mode.

Figure 6B:
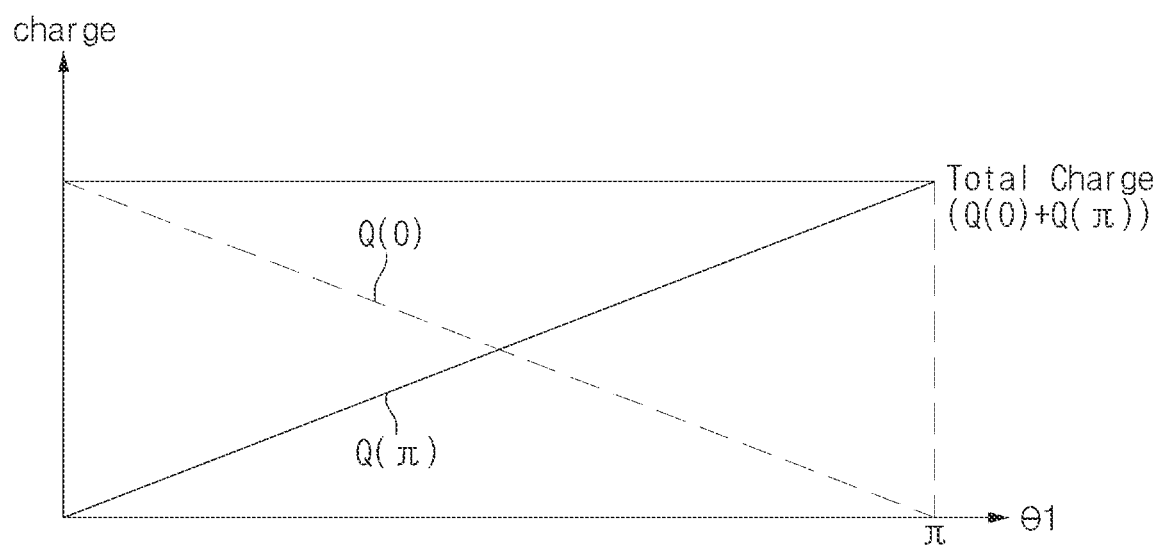
FIG. 6B is an example of a graph for describing a calculation of a phase difference between modulated light and incident light in a first mode.

FIG. 6B is a graph for describing the principle to calculate a phase difference between modulated light and incident light in the first mode.

FIG. 6A illustrates examples of modulated light ML, incident light IL, the first demodulation control signal CSa and the second demodulation control signal CSb in the first mode.

The modulated light ML may indicate light which is emitted to the target object 1 by the light source 10 controlled by the control block 40. The modulated light ML may be generated to alternately have a period in which the modulated light ML has a high level (i.e. period in which light is emitted) and a period in which the modulated light ML has a low level (i.e. section in which light is not emitted).

The incident light IL may indicate light which is incident into the substrate and thus generates an electron-hole pair through the photo-electric effect. The incident light IL may have a phase difference θ1 which is changed according to the distance between the image sensing device ISD and the target object 1.

The level of each of the modulated light ML and the incident light IL may indicate the intensity of the light.

While electrons generated by the incident light IL are captured, each of the first and second demodulation control signals CSa and CSb may alternately have an inactive voltage (low level) and an active voltage (high level). Furthermore, the first demodulation control signal CSa may be in phase with the modulated light ML, and the second demodulation control signal CSb may be exactly out of phase from the modulated light ML (or a phase difference of 180° (π)). In the present embodiment, suppose that the modulated light ML and the light modulation signal MLS for generating modulated light have no phase difference. Thus, the modulated light ML and the light modulation signal MLS may be in phase with each other.

In a first period PR1, the first demodulation control signal CSa may have an active voltage, and the second demodulation control signal CSb may have an inactive voltage. Therefore, electrons generated by the incident light IL incident in the first period PR1 may be migrated to the first tap TA1223 by the hole current HC1, and captured by the first detection node DN23*a*. In the first period PR1, the electrons captured by the first detection node DN23*a* may be defined as Q(0).

In a second period PR2, the first demodulation control signal CSa may have an inactive voltage, and the second demodulation control signal CSb may have an active voltage. Therefore, electrons generated by the incident light IL incident in the second period PR2 may be migrated to the second tap TB2334 by the hole current HC2, and captured by the second detection node DN23*b*. In the second period PR2, the electrons captured by the second detection node DN23*b* may be defined as Q(π).

That is, electrons generated by the incident light IL having a phase difference θ1 which is changed according to the distance between the image sensing device ISD and the target object 1 may be captured by the first detection node DN23*a* in the first period PR1 or captured by the second detection node DN23*b* in the second period PR2.

FIG. 6B is a graph illustrating the relationships between the phase difference θ1 and the detected Q(0) and Q(π). In FIG. 6B, the Y-axis indicates charge, and the X-axis indicates a phase difference.

The total charge generated by the incident light IL may be defined as the sum of Q(0) and Q(π). As the phase difference increases, Q(π) linearly increases, and Q(0) linearly decreases. Therefore, based on the ratio of Q(0) to Q(π), the phase difference θ1 may be calculated.

For example, the phase difference θ1 may be calculated according to Equation 1 below.

$$\theta 1 = \pi \times \frac{Q(\pi)}{Q(0) + Q(\pi)} \qquad \text{[Equation 1]}$$

The image processor (not illustrated) may calculate a phase difference by calculating the ratio of Q(0) to Q(π), based on image data corresponding to Q(0) received from the pixel P23 and captured in the first period PR1 and image data corresponding to Q(π) captured in the second period PR2, thereby acquiring the distance between the image sensing device ISD and the target object 1.

FIGS. 7 to 10 are diagrams for describing an operation of the image sensing device which operates in the second mode.

Figure 7:
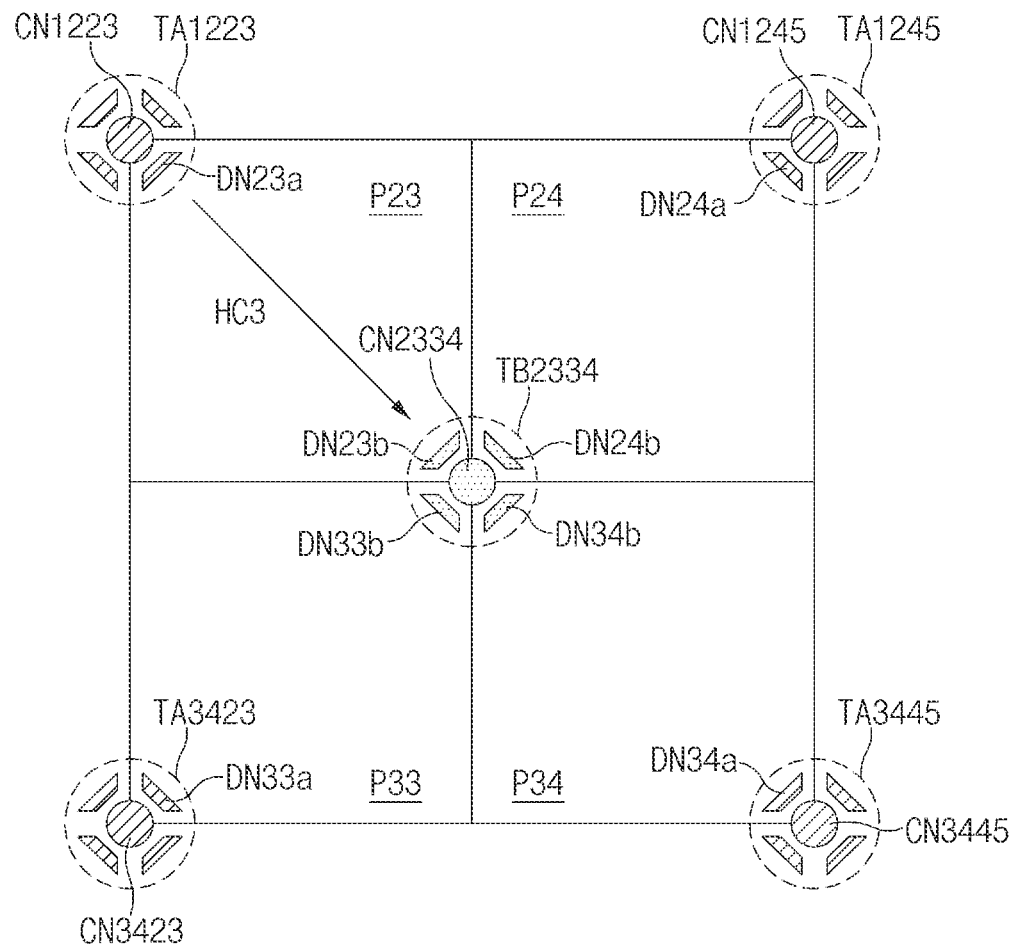
FIGS. 7 to 10 are examples of diagrams for describing an operation of an image sensing device which operates in a second mode.

Referring to FIG. 7, in the second mode, the capturing of the photocharges by the photo-electric conversion region 100 may be performed over the first to fourth periods which are different time periods.

While the first mode is performed in units of pixels (for example, P23), the second mode may be performed in units of pixel groups each including four pixels adjacent to each other and arranged in a 2×2 matrix. In FIGS. 7 to 10, a pixel group including pixels P23, P24, P33 and P34 will be taken as an example for description. However, the same structure and operation may be applied to other pixel groups within the pixel array 30. The pixels P23, P24, P33 and P34 may be defined as a first pixel, a third pixel, a second pixel and a fourth pixel, respectively.

The pixel group corresponding to a rectangle may have vertex regions in which first taps TA1223, TA1245, TA3423 and TA3445 are disposed, respectively, and a second tap TB2334 may be disposed in the center of the pixel group.

In the first period, incident light incident into the pixel P23 may be photo-electrically converted according to the photo-electric effect, and thus generate an electron-hole pair corresponding to the intensity of the incident light. At this time, the control circuit 41 may apply the first demodulation control signal CSa-1 to the first control node CN1223, and apply the second demodulation control signal CSb to the second control node CN2334. At this time, the voltage of the first demodulation control signal CSa-1 may be an active voltage, and the voltage of the second demodulation control signal CSb may be an inactive voltage.

A voltage difference between the first and second demodulation control signals CSa-1 and CSb may generate an electric field between the first and second control nodes CN1223 and CN2334, and a hole current HC3 may flow from the first control node CN1223 to the second control node CN2334. Electrons generated in the pixel P23 in response to the luminous intensity of incident light may be migrated toward the first control node CN1223 and captured by the first detection node DN23a adjacent to the first control node CN1223.

Figure 8:
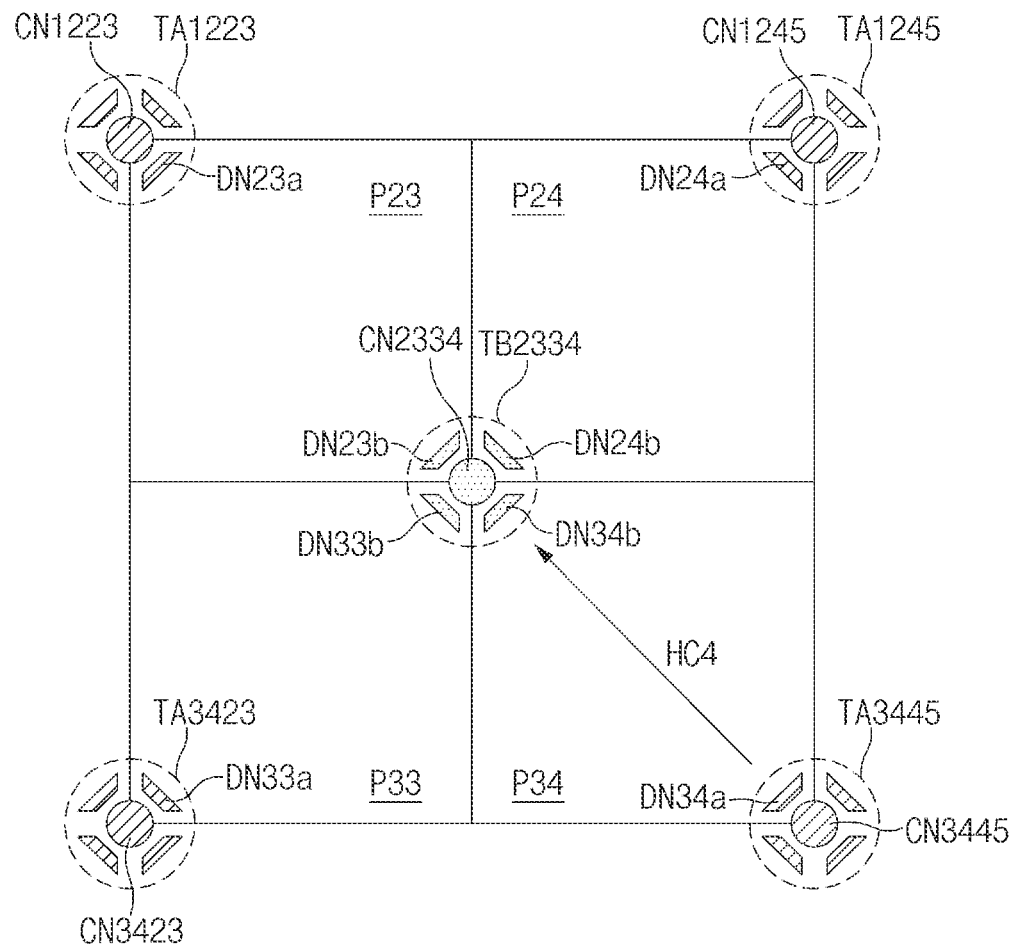

Referring to FIG. 8, in the second period succeeding the first period, incident light incident into the pixel P34 may be photo-electrically converted according to the photo-electric effect, and generate an electron-hole pair corresponding to the intensity of the incident light. At this time, the control circuit 41 may apply the first demodulation control signal CSa-2 to the first control node CN3445, and apply the second demodulation control signal CSb to the second control node CN2334. At this time, the voltage of the first demodulation control signal CSa-2 may be an active voltage, and the voltage of the second demodulation control signal CSb may be an inactive voltage.

A voltage difference between the first and second demodulation control signals CSa-2 and CSb may generate an electric field between the first and second control nodes CN3445 and CN2334, and a hole current HC4 may flow from the first control node CN3445 to the second control node CN2334. Electrons generated in the pixel P34 in response to the luminous intensity of incident light may be migrated toward the first control node CN3445 and captured by a first detection node DN34a adjacent to the first control node CN3445.

Figure 9:
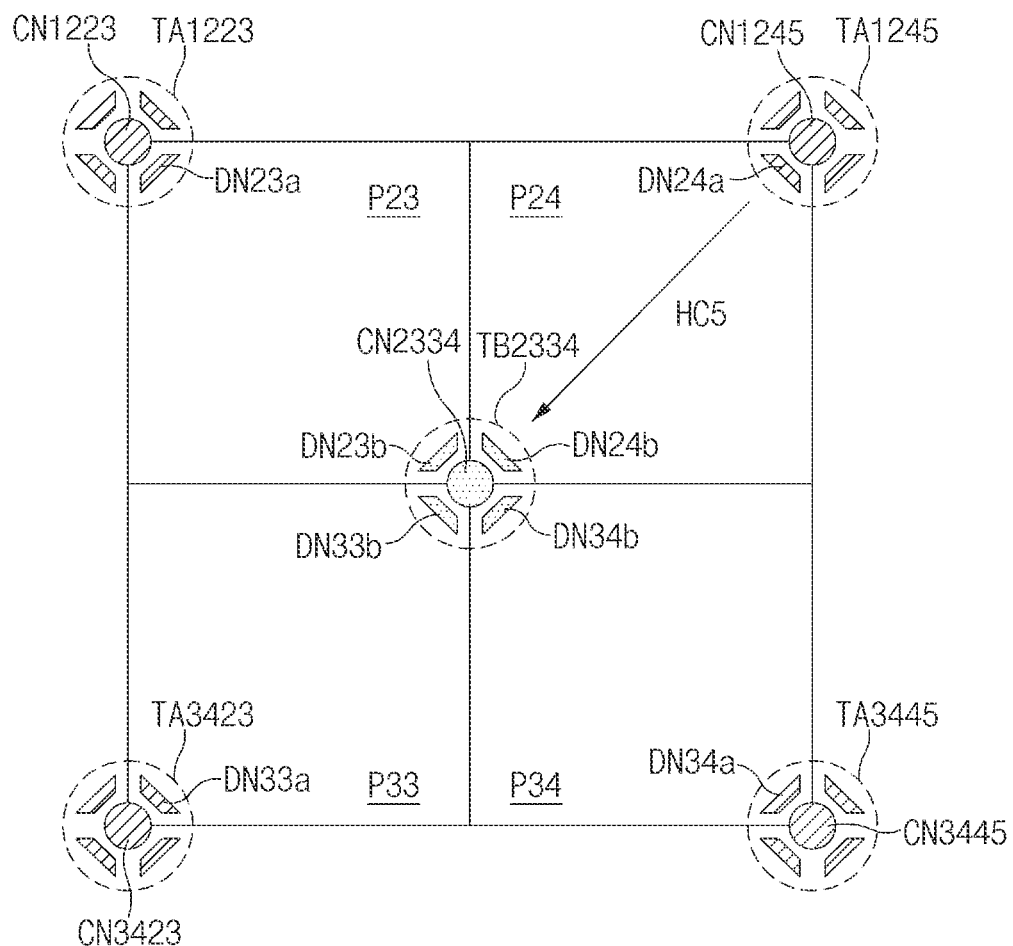

Referring to FIG. 9, in the third period, incident light incident into the pixel P24 may be photo-electrically converted according to the photo-electric effect, and thus generate an electron-hole pair corresponding to the intensity of the incident light. At this time, the control circuit 41 may apply a first demodulation control signal CSa-3 to a first control node CN1245, and apply the second demodulation control signal CSb to the second control node CN2334. At this time, the voltage of the first demodulation control signal CSa-3 may be an active voltage, and the voltage of the second demodulation control signal CSb may be an inactive voltage.

A voltage difference between the first and second demodulation control signals CSa-3 and CSb may generate an electric field between the first and second control nodes CN1245 and CN2334, and a hole current HC5 may flow from the first control node CN1245 to the second control node CN2334. Electrons generated in the pixel P24 in response to the luminous intensity of incident light may be migrated toward the first control node CN1245 and captured by a first detection node DN24a adjacent to the first control node CN1245.

Figure 10:
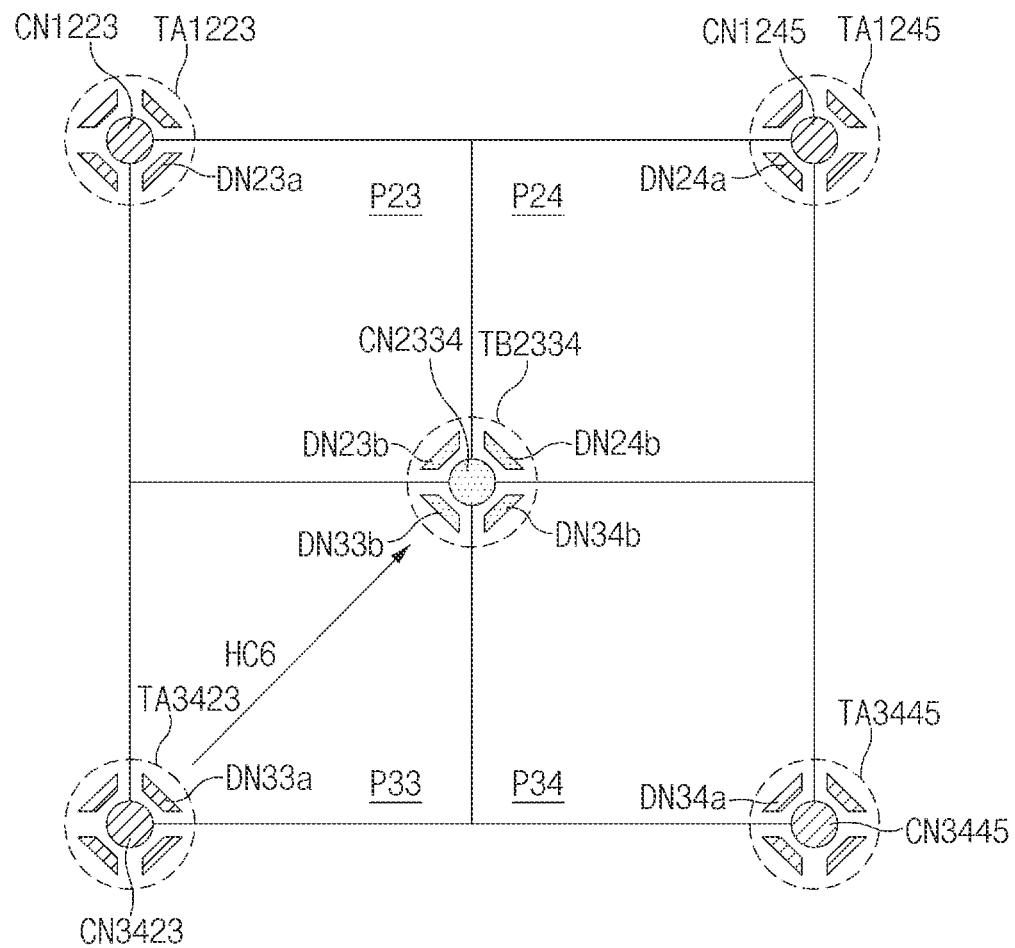

Referring to FIG. 10, in the fourth period succeeding the third period, incident light incident into the pixel P33 may be photo-electrically converted according to the photo-electric effect, and thus generate an electron-hole pair corresponding to the intensity of the incident light. At this time, the control circuit 41 may apply a first demodulation control signal CSa-4 to a first control node CN3423, and apply the second demodulation control signal CSb to the second control node CN2334. At this time, the voltage of the first demodulation control signal CSa-4 may be an active voltage, and the voltage of the second demodulation control signal CSb may be an inactive voltage.

A voltage difference between the first and second demodulation control signals CSa-4 and CSb may generate an electric field between the first and second control nodes CN3423 and CN2334, and a hole current HC6 may flow from the first control node CN3423 to the second control node CN2334. Electrons generated in the pixel P33 in response to the luminous intensity of incident light may be migrated toward the first control node CN3423 and captured by a first detection node DN33a adjacent to the first control node CN3423.

In the first to fourth periods, active voltages may be applied to the first control nodes CN1223, CN1245, CN3423 and CN3445 at different timings, and an inactive voltage may be continuously applied to the second control node CN2334.

Figure 11A:
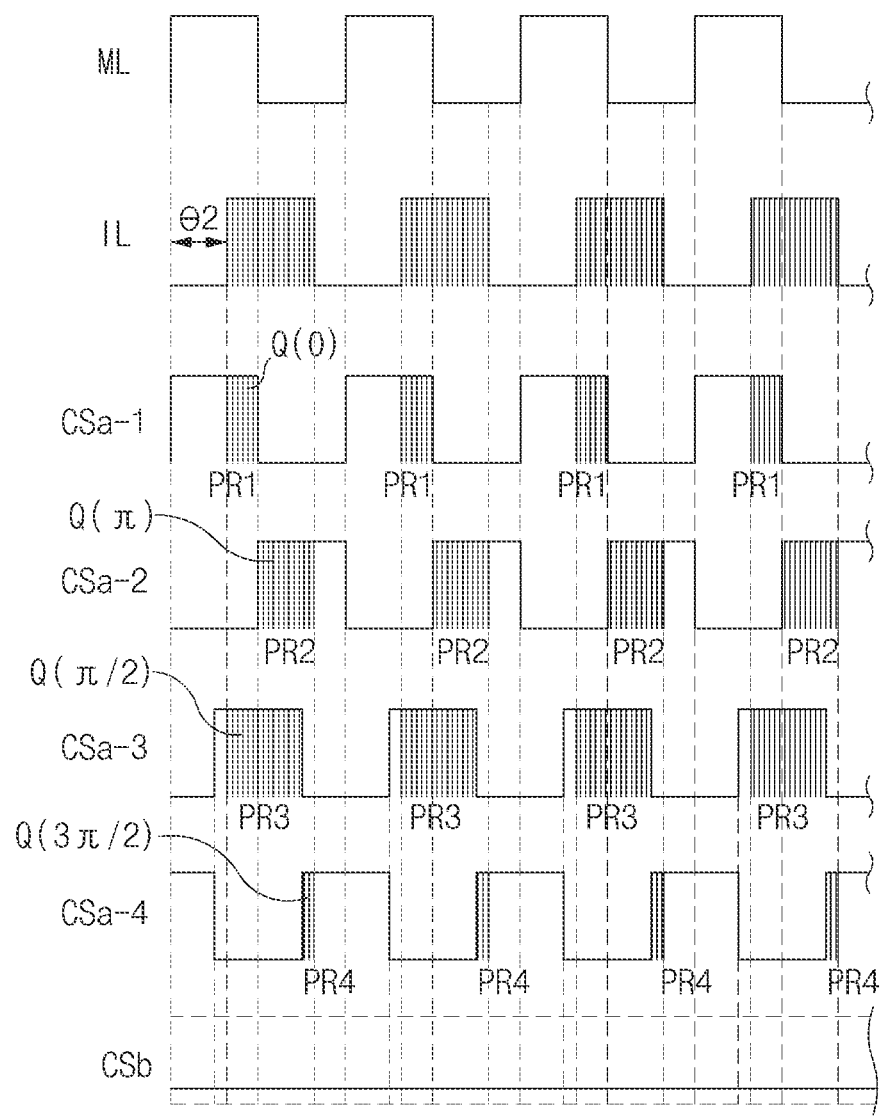
FIG. 11A is an example of a timing diagram for describing an operation of the image sensing device which operates in the second mode.
Figure 11B:
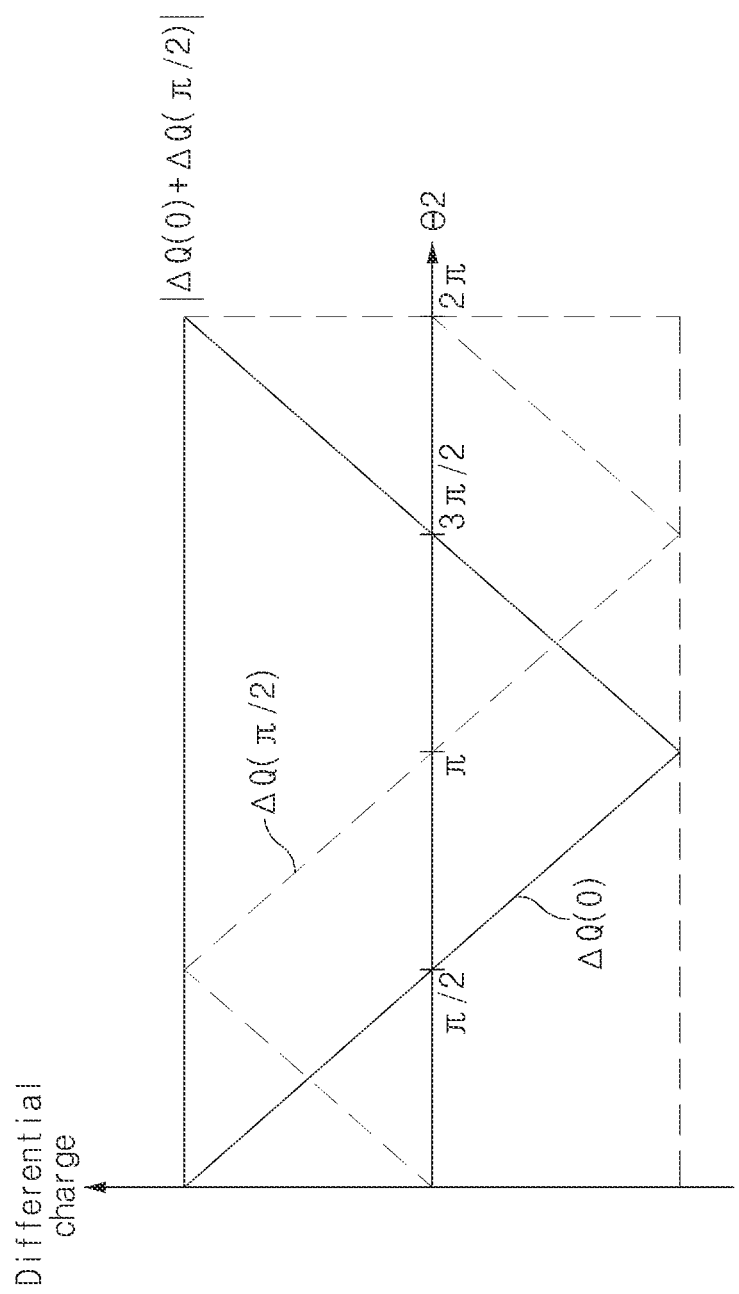
FIG. 11B is an example of a graph for describing a calculation of a phase difference between modulated light and incident light in a second mode.

FIG. 11A is a timing diagram for describing an operation of the image sensing device which operates in the second mode. FIG. 11B is a graph for describing the principle to calculate a phase difference between modulated light and incident light in the second mode.

FIG. 11A illustrates examples of the modulated light ML, the incident light IL, the first demodulation control signals CSa-1, CSa-2, CSa-3 and CSa-4 and the second demodulation control signal CSb in the second mode.

Since the modulated light ML and the incident light IL are substantially the same as those described with reference to FIG. 6A, the overlapping descriptions will be omitted herein. The incident light IL may have a phase difference θ2 which is changed according to the distance between the image sensing device ISD and the target object 1.

While electrons generated by the incident light IL are captured, each of the first demodulation control signals CSa-1, CSa-2, CSa-3 and CSa-4 may alternately have an inactive voltage and an active voltage. While electrons generated by the incident light IL are captured, the second demodulation control signal CSb may retain an inactive voltage. The first demodulation control signal CSa-1 may have be in phase with the modulated light ML, and the first demodulation control signal CSa-2 may be exactly out of phase from the modulated light ML (or a phase difference of 180° (π)). The first demodulation control signal CSa-3 may have a phase difference of 90° (π/2) from the modulated light ML, and the first demodulation control signal CSa-4 may have a phase difference of 270° (3π/2) from the modulated light ML.

In the first period PR1, the first demodulation control signal CSa-1 may have an active voltage, and the second demodulation control signal CSb may have an inactive voltage. Therefore, electrons generated by the incident light IL incident in the first period PR1 may be migrated to the first tap TA1223 by the hole current HC3, and captured by the first detection node DN23a. In the first period PR1, the electrons captured by the first detection node DN23a may be defined as Q(0).

In the second period PR2, the first demodulation control signal CSa-2 may have an active voltage, and the second demodulation control signal CSb may have an inactive voltage. Therefore, electrons generated by the incident light IL incident in the second period PR2 may be migrated to the first tap TA3445 by the hole current HC4, and captured by the first detection node DN34a. In the second period PR2, the electrons captured by the first detection node DN34a may be defined as Q(π).

In the third period PR3, the first demodulation control signal CSa-3 may have an active voltage, and the second demodulation control signal CSb may have an inactive voltage. Therefore, electrons generated by the incident light IL incident in the third period PR3 may be migrated to the first tap TA1245 by the hole current HC5, and captured by the first detection node DN24a. In the third period PR3, the electrons captured by the first detection node DN24a may be defined as Q(π/2).

In the fourth period PR4, the first demodulation control signal CSa-4 may have an active voltage, and the second demodulation control signal CSb may have an inactive voltage. Therefore, electrons generated by the incident light IL incident in the fourth period PR4 may be migrated to the first tap TA3423 by the hole current HC6, and captured by the first detection node DN33a. In the fourth period PR4, the electrons captured by the first detection node DN33a may be defined as Q(3π/2).

That is, electrons generated by the incident light IL having the phase difference θ2 which is changed according to the distance between the image sensing device ISD and the target object 1 may be captured by the first detection node DN23a in the first period PR1, captured by the first detection node DN34a in the second period PR2, captured by the first detection node DN24a in the third period PR3, or captured by the first detection node DN33a in the fourth period PR4.

The second mode may be performed in units of pixel groups each including pixels P23, P24, P33 and P34 adjacent to each other and arranged in a 2×2 matrix. The first detection node DN23a may capture electrons generated by the incident light IL incident into the pixel group in the first period PR1, the first detection node DN34a may capture electrons generated by the incident light IL incident into the pixel group in the second period PR2, the first detection node DN24a may capture electrons generated by the incident light IL incident into the pixel group in the third period PR3, and the first detection node DN33a may capture electrons generated by the incident light IL incident into the pixel group in the fourth period PR4.

In the present disclosure, the descriptions will be focused on the pixel group including the pixels P23, P24, P33 and P34. However, each of the four first detection nodes surrounding the first control node CN1223 may capture electrons generated by the incident light IL incident into different pixel groups in the first period PR1, and each of the four first detection nodes surrounding the first control node CN3445 may capture electrons generated by the incident light IL incident into different pixel groups in the second period PR2. Each of the four first detection nodes surrounding the first control node CN1245 may capture electrons generated by the incident light IL incident into different pixel groups in the third period PR3, and each of the four first detection nodes surrounding the first control node CN3423 may capture electrons generated by the incident light IL incident into different pixel groups in the fourth period PR4.

Therefore, the positions of the first taps corresponding to the first to fourth periods PR1 to PR4 in a pixel group included in the pixel array 30 may be different for each of the pixel groups. For example, in the case of the pixel group formed by the pixels P21, P22, P31 and P32, the first tap corresponding to the first period PR1 may be TA1223, the first tap corresponding to the second period PR2 may be TA3401, the first tap corresponding to the third period PR3 may be TA1201, and the first tap corresponding to the fourth period PR4 may be TA3423.

In the pixel array of FIG. 2, when demodulation control signals are applied as illustrated in FIG. 11A, pixels P12, P13, P16, P22, P23 and P26 may capture electrons in the first period PR1, pixels P31, P34, P35, P41, P44 and P45 may capture electrons in the second period PR2, pixels P11, P14, P15, P21, P24 and P25 may capture electrons in the third period PR3, and pixels P32, P33, P36, P42, P43 and P46 may capture electrons in the fourth period PR4.

Furthermore, a time period corresponding to any one first tap in one pixel group may not be fixed but be varied.

FIG. 11B is a graph illustrating the relationships between the phase difference θ2 and the detected Q(0), Q(π/2), Q(π) and Q(3π/2). In FIG. 11B, the Y-axis indicates differential charge, and the X-axis indicates a phase difference.

Suppose that electrons generated by the incident light IL incident into a pixel group are dividedly captured in the first and second periods PR1 and PR2 and the third and fourth periods PR3 and PR4, and the amount of charge captured in the first and second periods PR1 and PR2 and the amount of charge captured in the third and fourth periods PR3 and PR4 are equal to each other. That is, the total charge generated by the incident light IL may be defined as the sum of Q(0) and Q(π) or the sum of Q(π) and Q(3π/2).

The absolute value of a difference between Q(0) and Q(π) is defined as ΔQ(0)(=|Q(0)−Q(π)|), and the absolute value of a difference between Q(π/2) and Q(3π/2) is defined as ΔQ(π/2)(=|Q(π/2)−Q(3π/2)|). As the first demodulation control signal CSa-1 for acquiring Q(0) and the first demodulation control signal CSa-2 for acquiring Q(π) have a phase difference of 90° from the first demodulation control signal CSa-3 for acquiring Q(π/2) and the first demodulation control signal CSa-4 for acquiring Q(3π/2), the sum of ΔQ(0) and ΔQ(π/2) may have a constant value (i.e. total charge).

The graph of FIG. 11B illustrates a change in ΔQ(0) and ΔQ(π/2) depending on the phase difference θ2 with respect to the sum of ΔQ(0) and ΔQ(π/2) having a constant value. That is, as the phase difference θ2 increases, ΔQ(0) may linearly decrease in the section in which the phase difference θ2 ranges from 0 to π, and linearly increase in the section in which the phase difference θ2 ranges from n to 2π. Furthermore, ΔQ(π/2) may linearly increase in the section in which the phase difference θ2 ranges from 0 to π/2, linearly decrease in the section in which the phase difference θ2 ranges from π/2 to 3π/2, and linearly increase in the section in which the phase difference θ2 ranges from 3π/2 to 2π. Therefore, based on the ratio of ΔQ(0) to ΔQ(π/2), the phase difference may be calculated.

For example, the phase difference θ2 may be calculated according to Equation 2 below.

$$\theta 2 = \begin{cases} \frac{\pi}{2} \cdot \left(1 + \dfrac{-\Delta Q(0)}{|\Delta Q(0)| + |\Delta Q(\frac{\pi}{2})|}\right), & \text{if } \Delta Q(\frac{\pi}{2}) \geq 0 \\ \frac{\pi}{2} \cdot \left(3 + \dfrac{+\Delta Q(0)}{|\Delta Q(0)| + |\Delta Q(\frac{\pi}{2})|}\right), & \text{if } \Delta Q(\frac{\pi}{2}) < 0. \end{cases} \quad \text{[Equation 2]}$$

The image processor (not illustrated) may calculate ΔQ(0) and ΔQ(π/2), based on the image data corresponding to Q(0) captured in the first period PR1, the image data corresponding to Q(π) captured in the second period PR2, the image data corresponding to Q(π/2) captured in the third period PR3, and the image data corresponding to Q(3π/2) captured in the fourth period PR4, which are received from the pixels P23, P24, P33 and P34 included in the pixel group, and calculate the phase difference by calculating the ratio of ΔQ(0) to ΔQ(π/2), thereby acquiring the distance between the image sensing device ISD and the target object 1.

In particular, according to the 4-phase modulation method as in the second mode, differential values such as ΔQ(0) and ΔQ(π/2) may be used when the phase difference is calculated. Thus, background noise components contained in Q(0), Q(π), Q(π/2) and Q(3π/2), respectively, can be removed to make it possible to more accurately calculate the distance. Furthermore, since Q(0), Q(π), Q(π/2) and Q(3π/2) can be acquired at a time through one capturing operation, the distance calculation speed can be improved, and the distance calculation for an object which moves at high speed can be performed with precision.

Figure 12:
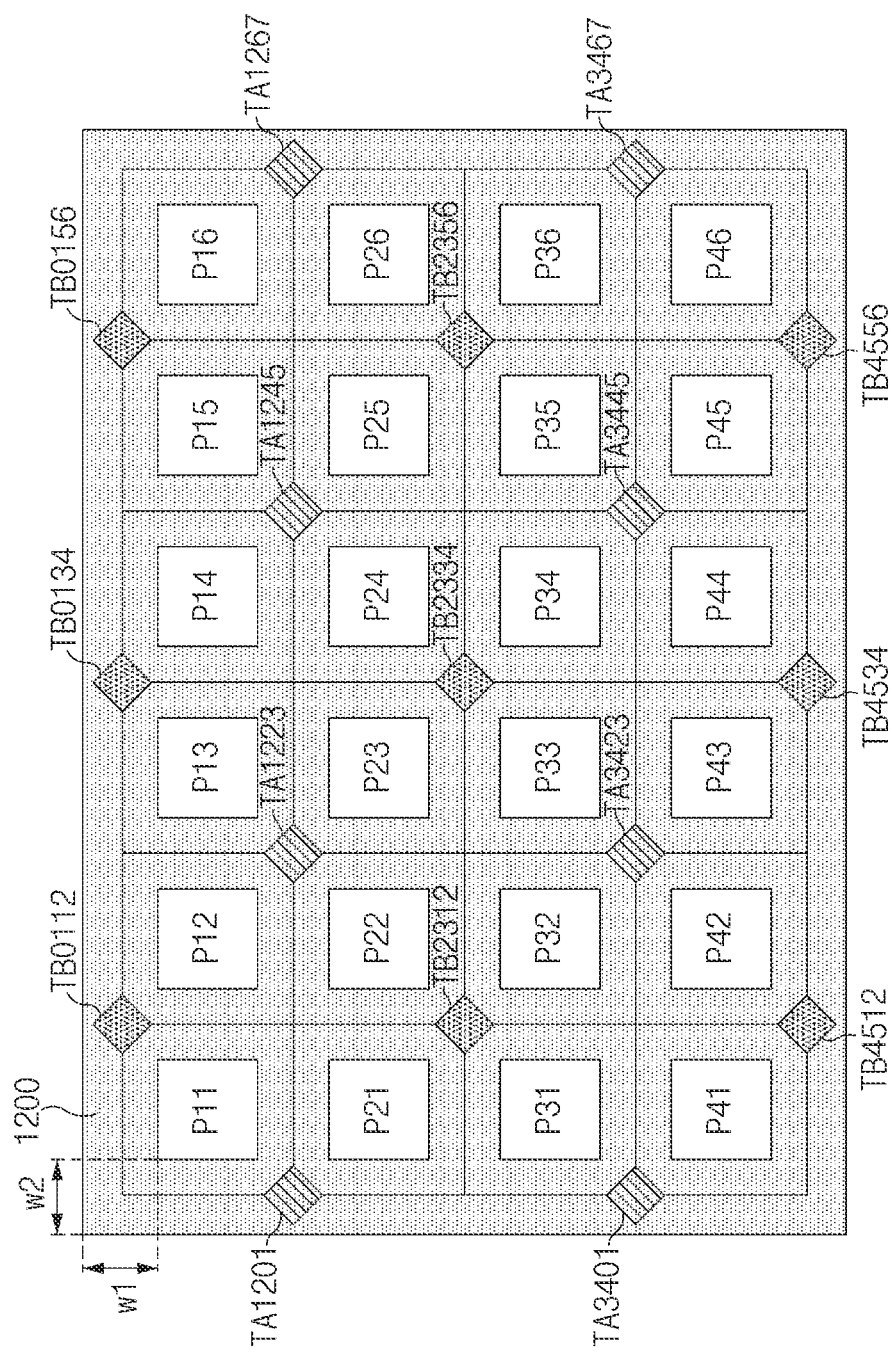
FIG. 12 illustrates an example of a grid structure disposed on a pixel array illustrated in FIG. 2.

FIG. 12 illustrates an example of a grid structure disposed on the pixel array illustrated in FIG. 2.

FIG. 12 illustrates a first grid structure 1200 disposed on the pixel array 30 of FIG. 2. For convenience description, in FIG. 12, the first taps (for example, TA1201) and the second taps (for example, TB0112) are shown as having a diamond shape.

The first grid structure 1200 may absorb or reflect light incident on the pixel array 30, thereby blocking transfer of light into the substrate. The first grid structure 1200 may include at least one of a metal (for example, tungsten) with a high light absorption rate or a metal (for example, aluminum) with high reflectivity.

The first grid structure 1200 may be elongated along the boundary between pixels adjacent to each other. The first grid structure 1200 may include a first region extended in a horizontal direction (or row direction) along the boundary between pixels adjacent to each other in a top-to-bottom direction and a second region extended in a vertical direction (or column direction) along the boundary between pixels adjacent to each other in a side-to-side direction. The first and second regions may be connected to each other and formed in a mesh type as a whole.

The region extended in the horizontal direction (or row direction) along the boundary between the pixels adjacent in the top-to-bottom direction may have a first width W1, and the region extended in the vertical direction (or column direction) along the boundary between the pixels adjacent in the side-to-side direction may have a second width W2. The first width W1 may be equal to or more than the vertical length of each of the first and second taps, and the second width W2 may be equal to or more than the horizontal length of each of the first and second taps. Therefore, the first grid structure 1200 may completely cover the first and second taps.

Electrons generated by light incident around the boundary between the pixels adjacent to each other are easily migrated and captured by adjacent pixels instead of pixels on which light is incident, which causes undesired effects such as cross-talk phenomenon. Thus, such electrons act as noise in a pixel signal.

Furthermore, light which is directly incident on the locations of the first and second taps may be photo-electrically converted in regions adjacent to the respective detection nodes of the first and second taps, thereby generating electrons. The electrons may be captured by a detection node that is closely located, regardless of a hole current. Thus, such electrons may act as noise in a pixel signal.

The first grid structure 1200 may minimize the generation of noise by light incident around the boundary between pixels adjacent to each other and light directly incident on each of the locations of the first and second taps.

Figure 13:
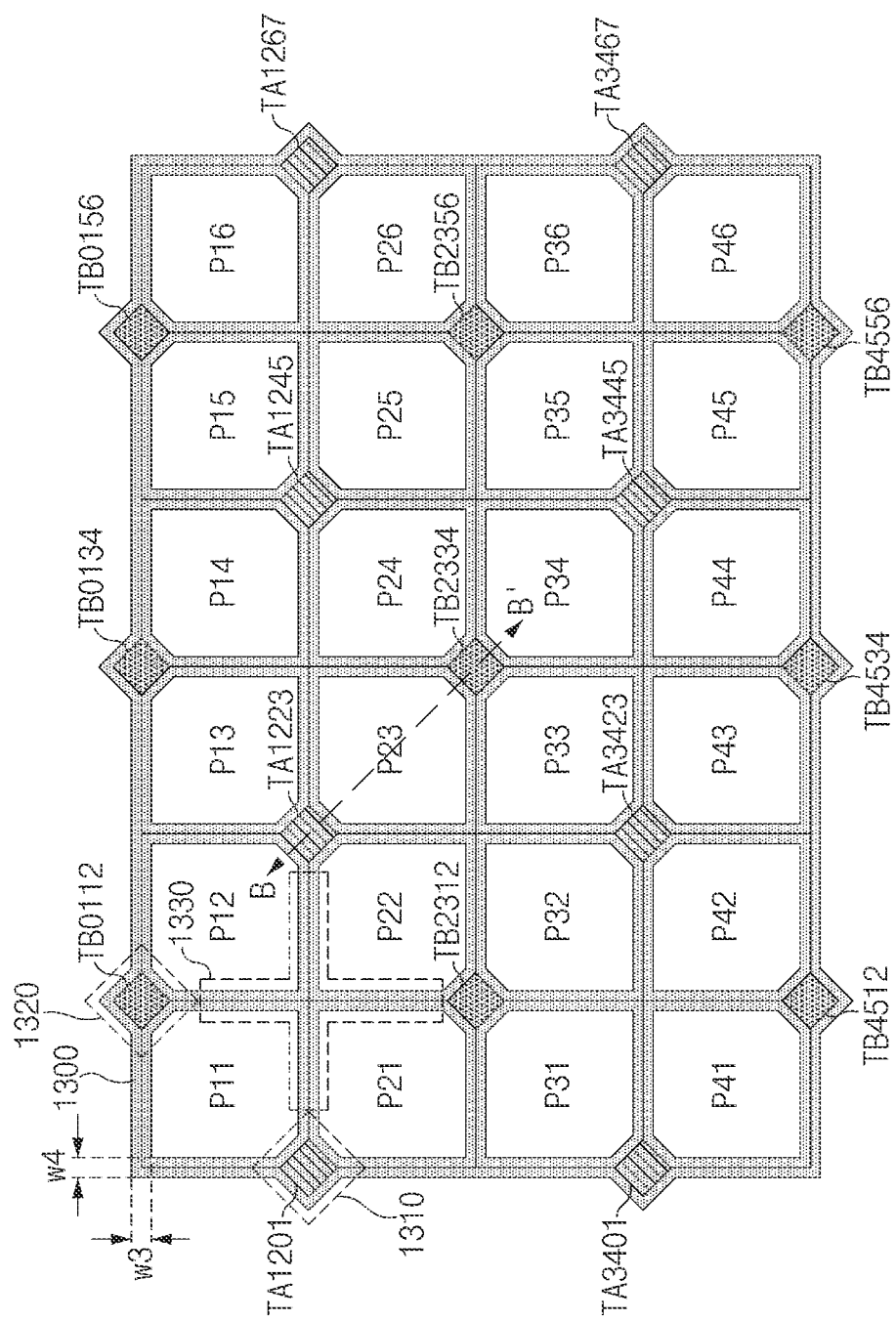
FIG. 13 illustrates another example of a grid structure disposed on a pixel array illustrated in FIG. 2.

FIG. 13 illustrates another example of a grid structure disposed on the pixel array illustrated in FIG. 2.

FIG. 13 illustrates a second grid structure 1300 disposed on the pixel array 30 of FIG. 2. Since the second grid structure 1300 has substantially the same function and material as the first grid structure 1200, the same descriptions will be omitted.

The second grid structure 1300 may include a first tap guard region 1310, a second tap guard region 1320 and a check region 1330.

The first tap guard region 1310 may have a shape and area corresponding to each of the first taps, and thus completely cover each of the first taps.

The second tap guard region 1320 may have a shape and area corresponding to each of the second taps, and thus completely cover each of the second taps.

The check region 1330 may be elongated along the boundary between the pixels adjacent to each other. The check region 1330 extended in a horizontal direction (or row direction) along the boundary between pixels adjacent in the top-to-bottom direction may have a third width W3, and the check region 1330 extended in a vertical direction (or column direction) along the boundary between pixels adjacent in the side-to-side direction may have a fourth width W4. The third width W3 may be less than the vertical length of each of the first and second taps, and the fourth width W4 may be less than the horizontal length of each of the first and second taps. The third and fourth widths W3 and W4 of the check region 1330 may have values which have been experimentally decided to raise the light receiving efficiency of the pixels while reducing cross-talk.

The second grid structure 1300 may reduce noises generated by light incident around the boundary between pixels adjacent to each other and light directly incident on each of the locations of the first and second taps, and optimize the light receiving efficiency of the pixels.

Figure 14:
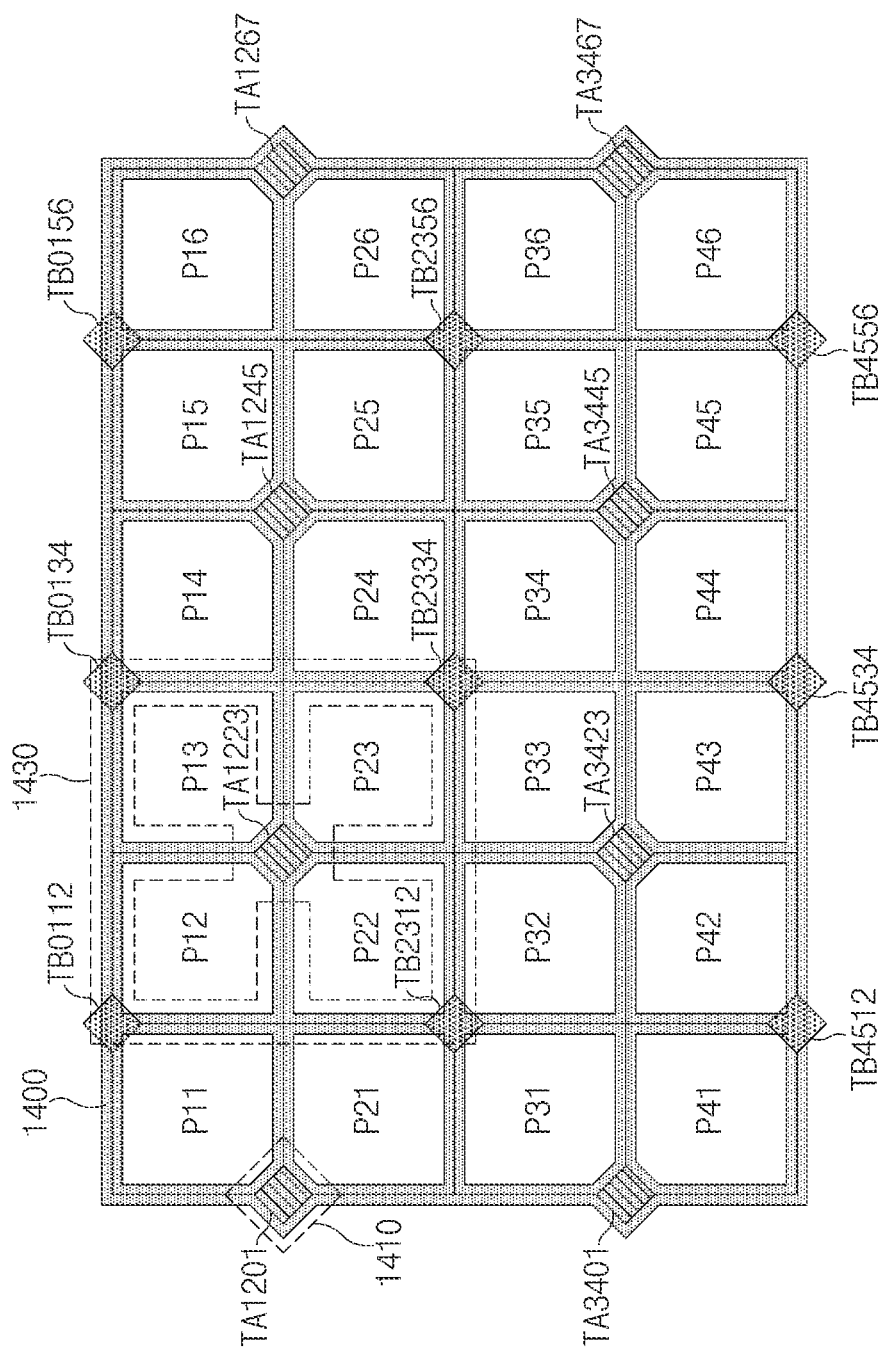
FIG. 14 illustrates still another example of a grid structure disposed on a pixel array illustrated in FIG. 2.

FIG. 14 illustrates still another example of the grid structure disposed on the pixel array illustrated in FIG. 2.

FIG. 14 illustrates a third grid structure 1400 disposed on the pixel array 30 of FIG. 2. Since the third grid structure 1400 has the same function and material as the first grid structure 1200, the overlapping descriptions will be omitted.

The third grid structure 1400 may include a first tap guard region 1410 and a check region 1430. Since the structures and functions of the first tap guard region 1410 and the check region 1430 are substantially the same as those of the first tap guard region 1310 and the check region 1330 which are described with reference to FIG. 13, the same descriptions are omitted herein.

The third grid structure 1400 may not include a second tap guard region unlike the second grid structure 1300. The third grid structure 1400 may be applied to the image sensing device ISD which operates in the second mode. This is because, since the second taps are continuously deactivated in the second mode (an inactive voltage is applied to the control node and electron capture by the detection node is not performed), light which is directly incident on the location of each of the second taps does not need to be blocked. Therefore, the third grid structure 1400 may not only reduce the generation of noise by light incident around the boundary between pixels adjacent to each other and light directly incident on each of the locations of the first taps, and but also optimize the light receiving efficiency of the pixels.

Figure 15:
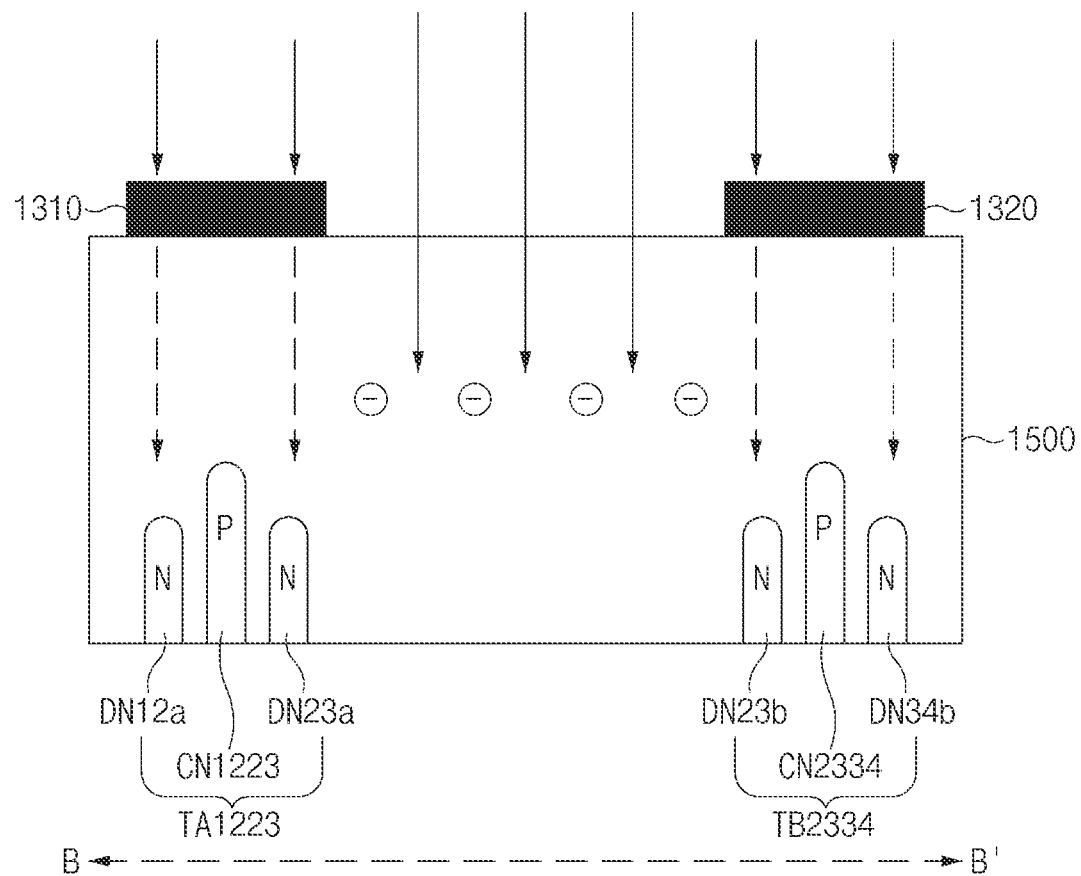
FIG. 15 is an example of a diagram for describing grid structures illustrated in FIGS. 12 to 14.

FIG. 15 is a diagram for describing the grid structures illustrated in FIGS. 12 to 14.

FIG. 15 briefly and representatively illustrates a cross-section of the grid structure, taken along a second cutting line B-B' of FIG. 13, among the grid structures illustrated in FIGS. 12 to 14.

A substrate 1500 may include a first surface on which light is incident and a second surface facing the first surface.

On the left side of the inside of the substrate 1500, a first tap TA1223 may be disposed adjacent to the second surface. On the right side of the inside of the substrate 1500, a second tap TB2334 may be disposed adjacent to the second surface.

The first tap guard region 1310 may be disposed on the first surface of the substrate 1500 so as to overlap the first tap TA1223.

The second tap guard region 1320 may be disposed on the first surface of the substrate 1500 so as to overlap the second tap TB2334.

The first and second tap guard regions 1310 and 1320 may block lights which are directly incident on the locations of the detection nodes DN12a, DN23a, DN23b and DN34b, respectively, as indicated by dotted lines. Furthermore, electrons generated by light incident through an opening except the first and second tap guard regions 1310 and 1320 may contribute to the pixel signal of the pixel P23.

FIGS. 16A to 16F are diagrams illustrating other embodiments of the tap included in the pixel array of FIG. 1.

Referring to FIGS. 16A to 16F, a tap constituted by a control node (for example, 1610) and detection nodes (for example, 1615-1 to 1615-4) may be the first or second tap included in a pixel array 30. Except differences which will be described below, the structures and operations of the control nodes and the detection nodes of FIGS. 16A to 16F are substantially the same as those of the control nodes and the detection nodes described with reference to FIG. 2.

In FIGS. 16A to 16D, each of the control nodes 1610, 1620, 1630 and 1640 may have a circular shape, and the shapes of the detection nodes may be modified.

Figure 16A:
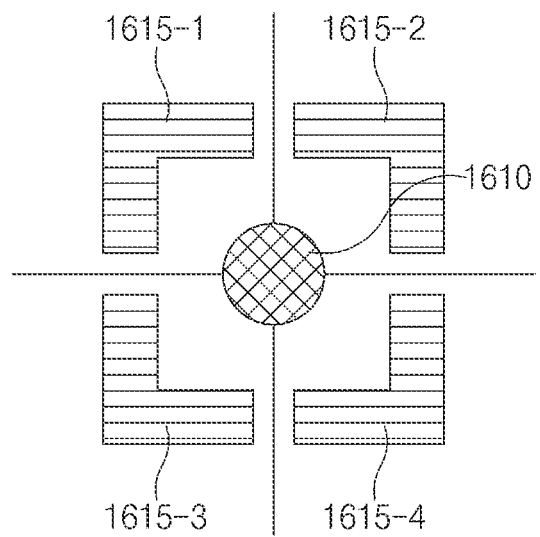
FIGS. 16A to 16F are diagrams illustrating other embodiments of a tap included in the pixel array of FIG. 1.

In FIG. 16A, each of the detection nodes 1615-1 to 1615-4 surrounding the control node 1610 may be formed in an L-shape such that a bent portion thereof is disposed to face a direction away from the control node 1610.

Figure 16B:
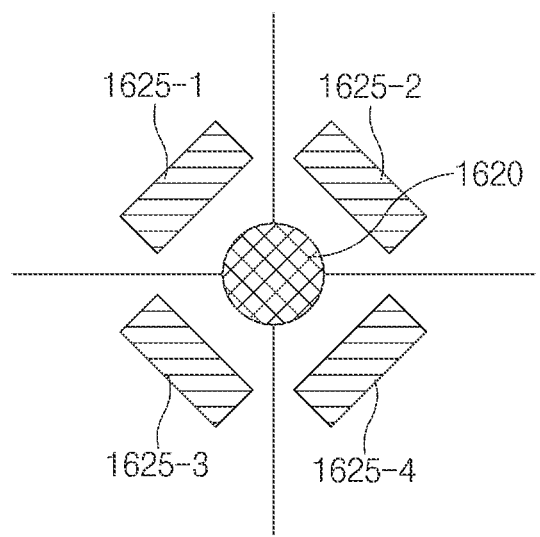

In FIG. 16B, each of detection nodes 1625-1 to 1625-4 surrounding the control node 1620 may be formed in a rectangular shape such that each side thereof is rotated at a predetermined angle with respect to each side of the pixel.

Figure 16C:
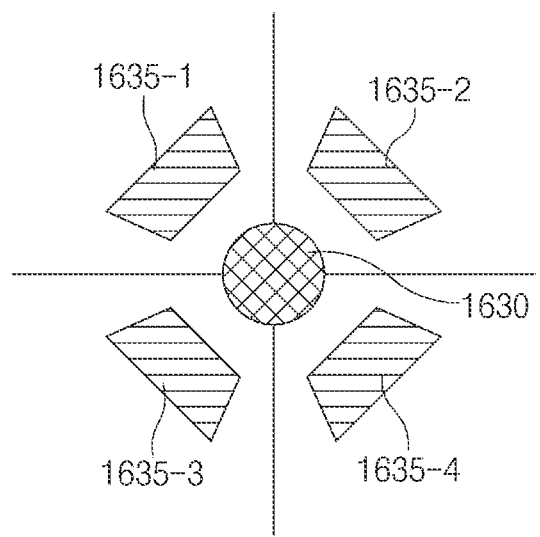

In FIG. 16C, each of detection nodes 1635-1 to 1635-4 surrounding the control node 1630 may be formed in a trapezoidal shape such that each side thereof is rotated at a predetermined angle with respect to each side of the pixel. The ratio of a side of each of the detection nodes 1635-1 to 1635-4, adjacent to the control node 1630, to a side facing the adjacent side may be smaller than in the detection nodes of FIG. 2.

Figure 16D:
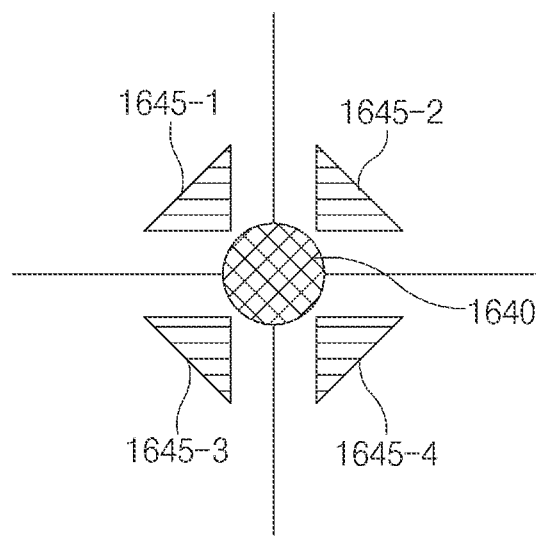

In FIG. 16D, each of detection nodes 1645-1 to 1645-4 surrounding the control node 1640 may be formed in a right-angled triangle shape such that the hypotenuse thereof is disposed away from the control node 1640 and the vertex region corresponding to the right angle is disposed close to the control node 1640.

Although the detection nodes of FIGS. 16A to 16D have different shapes from one another, each of the detection nodes is provided in order to surround the corresponding control node over as wide an area as possible. The detection nodes having such a shape may more easily capture a signal carrier which migrates along a hole current formed by the control node.

Figure 16E:
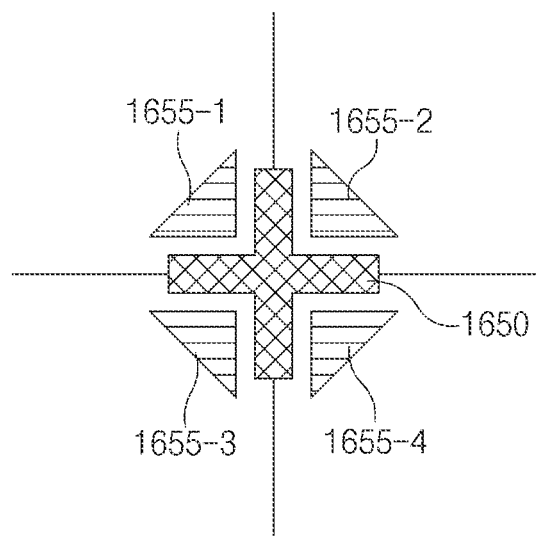

In FIG. 16E, the control node 1650 may have a cross shape (+) which has four legs extended in four directions from vertex regions. Each of detection nodes 1655-1 to 1655-4 surrounding the control node 1650 may have the same shape as described with reference to FIG. 16D. Therefore, as the control node 1650 has a shape extended along the sides of the detection nodes 1655-1 to 1655-4 except the hypotenuses thereof, the control node 1650 may form the width of the hole current, which is similar to the widths of the detection nodes 1655-1 to 1655-4. Thus, a signal carrier can be captured more efficiently.

Figure 16F:
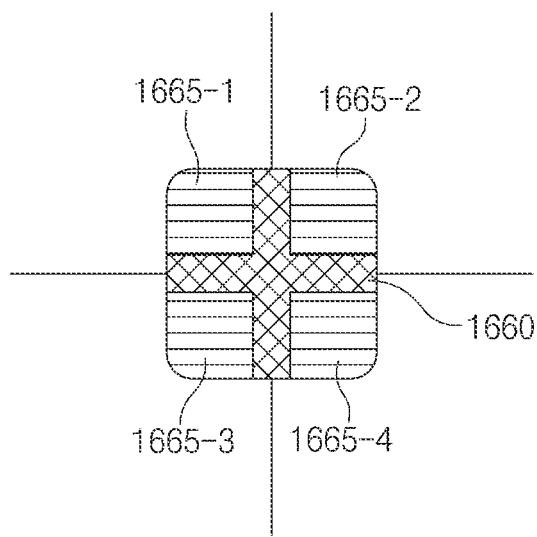

In FIG. 16F, a control node 1660 may have the same shape as described with reference to FIG. 16E. The control node 1660 may have a similar shape to a coordinate axis, and detection nodes 1665-1 to 1665-4 surrounding the control node 1660 may be formed in a shape to fill the quadrants of the coordinate axis formed by the control node 1660. Each of the detection nodes 1665-1 to 1665-4 may have a rectangular shape. The control node 1660 and each of the detection nodes 1665-1 to 1665-4 may be disposed to abut on each other. Therefore, the control node 1660 and the detection nodes 1665-1 to 1665-4 may have a shape in which a cross shape is included in a rectangle.

Since the control node 1660 and the detection nodes 1665-1 to 1665-4 are disposed to abut on each other, the control node 1660 and the detection nodes 1665-1 to 1665-4 may be physically isolated from each other only by junction isolation through the opposite doping. In the disclosed technology, a control node and detection nodes adjacent to the control node are spaced by a predetermined distance apart from each other. According to the present embodiment, however, a control node and detection nodes adjacent to the control node may be isolated from each other only through junction isolation, like the control node 1660 and the detection nodes 1665-1 to 1665-4.

When a control node and detection nodes adjacent to the control node are spaced by a predetermined distance apart from each other, the control node and the detection nodes adjacent to the control node may be isolated from each other by a dielectric layer formed by gap-filling a trench, formed by an STI (Shallow Trench Isolation) process, with a dielectric material.

Although FIGS. 16A to 16F illustrate the shapes and arrangements of the control nodes and the detection nodes, the scope of the disclosed technology is not limited thereto. In accordance with various embodiments, the control node may be disposed so as to be shared by pixels adjacent to each other, and the detection nodes corresponding to the respective pixels adjacent to each other may be physically isolated from one another.

Figure 17:
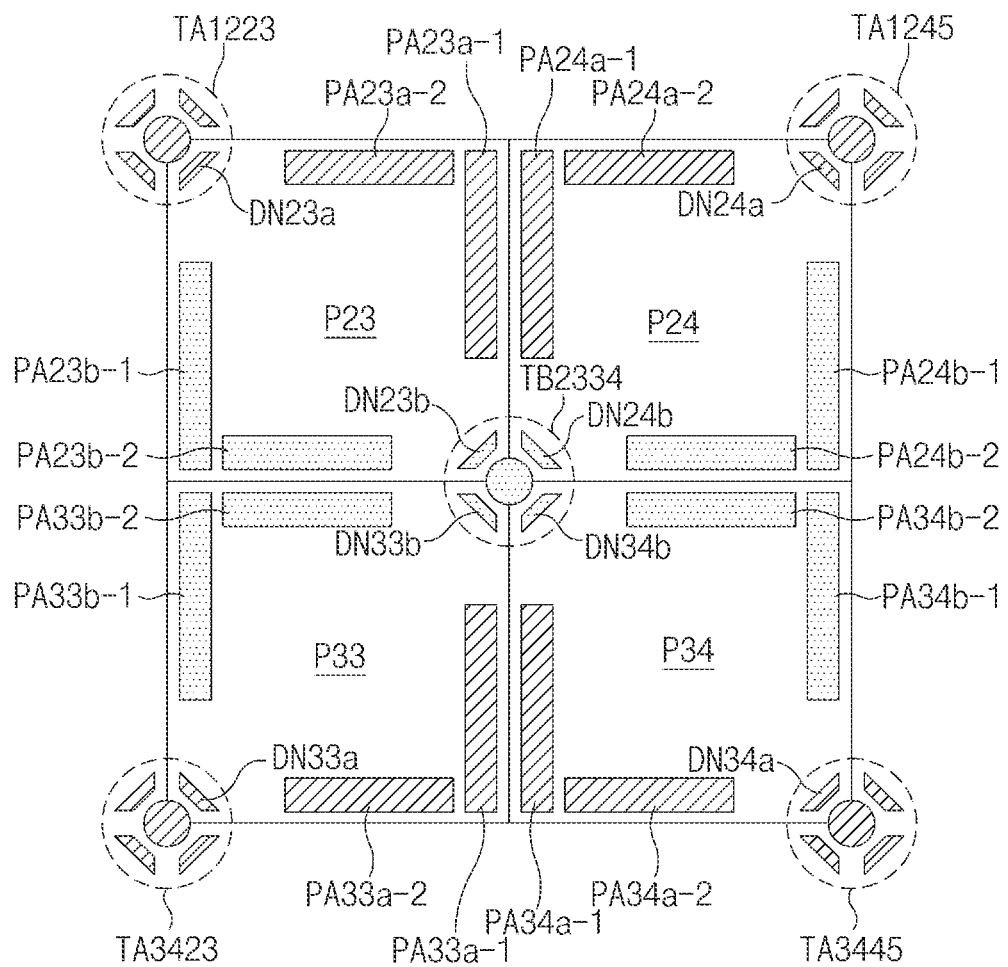
FIG. 17 illustrates an example of a pixel transistor region disposed on the pixel array illustrated in FIG. 2.

FIG. 17 illustrates an example of a pixel transistor region disposed on the pixel array illustrated in FIG. 2.

In FIG. 17, the pixels P23, P24, P33 and P34 will be taken as an example for description. However, the other pixels may also have substantially the same structure.

First, the pixel P23 may include a first pixel transistor region PA23*a*-1 and PA23*a*-2 and a second pixel transistor region PA23*b*-1 and PA23*b*-2.

The first pixel transistor region PA23*a*-1 and PA23*a*-2 may include transistors for processing photocharge captured by the first detection node DN23*a* of the first tap TA1223. The first pixel transistor region PA23*a*-1 and PA23*a*-2 may be separated into two regions, and the first pixel transistor region PA23*a*-1 may be extended along one side (i.e. right side) connected to a second vertex region of the pixel P23, and the first pixel transistor region PA23*a*-2 may be extended along the other side (i.e. top side) connected to the second vertex region of the pixel P23. According to another embodiment, the first pixel transistor region may not be separated into two regions but be formed in an L-shape, such that a bent portion thereof is adjacent to the second vertex region of the pixel P23.

The second pixel transistor region PA23*b*-1 and PA23*b*-2 may include transistors for processing photocharge captured by the second detection node DN23*b* of the second tap TB2334. The second pixel transistor region PA23*b*-1 and PA23*b*-2 may be separated into two regions, and the second pixel transistor region PA23*b*-1 may be extended along one side (i.e. left side) connected to a third vertex region of the pixel P23, and the second pixel transistor region PA23*b*-2 may be extended along the other side (i.e. bottom side) connected to the third vertex region of the pixel P23. According to another embodiment, the second pixel transistor region may not be separated into two regions but be formed in an L-shape, such that a bent portion thereof is adjacent to the third vertex region of the pixel P23.

In the pixel P23, the first pixel transistor region PA23*a*-1 and PA23*a*-2 and the second pixel transistor region PA23*b*-1 and PA23*b*-2 may be disposed symmetrically with respect to a diagonal line connecting a first vertex region and a fourth vertex region.

Due to such a symmetrical disposition, resistance components (for example, the length of a metal line and parasitic capacitance) present between the first tap TA1223 and the first pixel transistor region PA23*a*-1 and PA23*a*-2 in the pixel P23 may be equalized to resistance components (for example, the length of a metal line and parasitic capacitance) present between the second tap TB2334 and the second pixel transistor region PA23*b*-1 and PA23*b*-2. Thus, noise components included in the pixel signals of the first pixel transistor region PA23*a*-1 and PA23*a*-2 and the second pixel transistor region PA23*b*-1 and PA23*b*-2 may be substantially equalized to each other, and easily removed by the image processor (not illustrated) or the like.

A first pixel transistor region PA33*a*-1 and PA33*a*-2 and a second pixel transistor region PA33*b*-1 and PA33*b*-2 of the pixel P33 may be disposed symmetrically with the first pixel transistor region PA23*a*-1 and PA23*a*-2 and the second pixel transistor region PA23*b*-1 and PA23*b*-2 of the pixel P23, based on the boundary between the pixels P33 and P23 (i.e. the bottom side of the pixel P23).

A first pixel transistor region PA24*a*-1 and PA24*a*-2 and a second pixel transistor region PA24*b*-1 and PA24*b*-2 of the pixel P24 may be disposed symmetrically with the first pixel transistor region PA23*a*-1 and PA23*a*-2 and the second pixel transistor region PA23*b*-1 and PA23*b*-2 of the pixel P23, based on the boundary between the pixels P24 and P23 (i.e. the right side of the pixel P23).

Although not illustrated in FIG. 17, the pixel transistor regions of the pixel P13 may be disposed symmetrically with the pixel transistor regions of the pixel P23 based on the boundary between the pixel P13 and the pixel P23. Furthermore, the pixel transistor regions of the pixel P22 may be disposed symmetrically with the pixel transistor regions of the pixel P23 based on the boundary between the pixel 22 and the pixel P23.

The pixel transistor regions of the pixel P34 may be disposed symmetrically with the corresponding pixel transistor regions of the pixel P24 based on the boundary between the pixels P24 and P34, and the pixel transistor regions of the pixel P34 may be disposed symmetrically with the corresponding pixel transistor regions of the pixel P33 based on the boundary between the pixels P33 and P34.

A pixel within the pixel array 30 may have a symmetrical structure with an adjacent pixel based on the boundary with the adjacent pixel.

Therefore, as pixels adjacent to each other are disposed symmetrically with each other based on the boundary therebetween, the resistance components present between the first tap and the first pixel transistor region and the resistance components present between the second tap and the second pixel transistor region may be equalized in the entire pixel array 30. Therefore, noise components contained in the pixel signals of the first and second pixel transistor regions may be substantially equalized in the entire pixel array 30, and thus easily removed by the image processor (not illustrated) or the like.

Each of the first and second pixel transistor regions, which are included in a pixel, may be extended along the sides around each of the corresponding vertex regions where no taps are disposed. Due to such a structure, the pixel transistor regions of the pixels adjacent to one another around the vertex region where no taps are disposed may have a cross shape (+).

In the second vertex region of the pixel P23, for example, the first pixel transistor regions of the pixels P13, P14, P23 and P24 adjacent to one another around the second vertex region of the pixel P23 are gathered and disposed in a cross shape (+).

In the third vertex region of the pixel P23, for example, the second pixel transistor regions of the pixels P22, P23, P32 and P33 adjacent to one another around the third vertex region of the pixel P23 are gathered and arranged in a cross shape (+).

Although not illustrated, a voltage stabilization region may be disposed at a vertex region where no tap is disposed. Alternatively, the voltage stabilization region may not be disposed at the vertex region where no tap is disposed, but be disposed at the boundary between pixels adjacent to each other.

The voltage stabilization region may receive a ground voltage, and clamp the voltage of a P-well adjacent to the voltage stabilization region to a specific voltage (for example, ground voltage). The P-well may be disposed at the bottoms of the first pixel transistor regions or the second pixel transistor regions of four pixels adjacent to the voltage stabilization region, and thus form the bodies of the respective transistors. The voltage of the P-well may have an influence on the threshold voltages of the respective transistors. The voltage stabilization region may clamp the voltage of the P-well, and thus guarantee stable operations of the transistors included in the first pixel transistor regions or the second pixel transistor regions.

Figure 18:
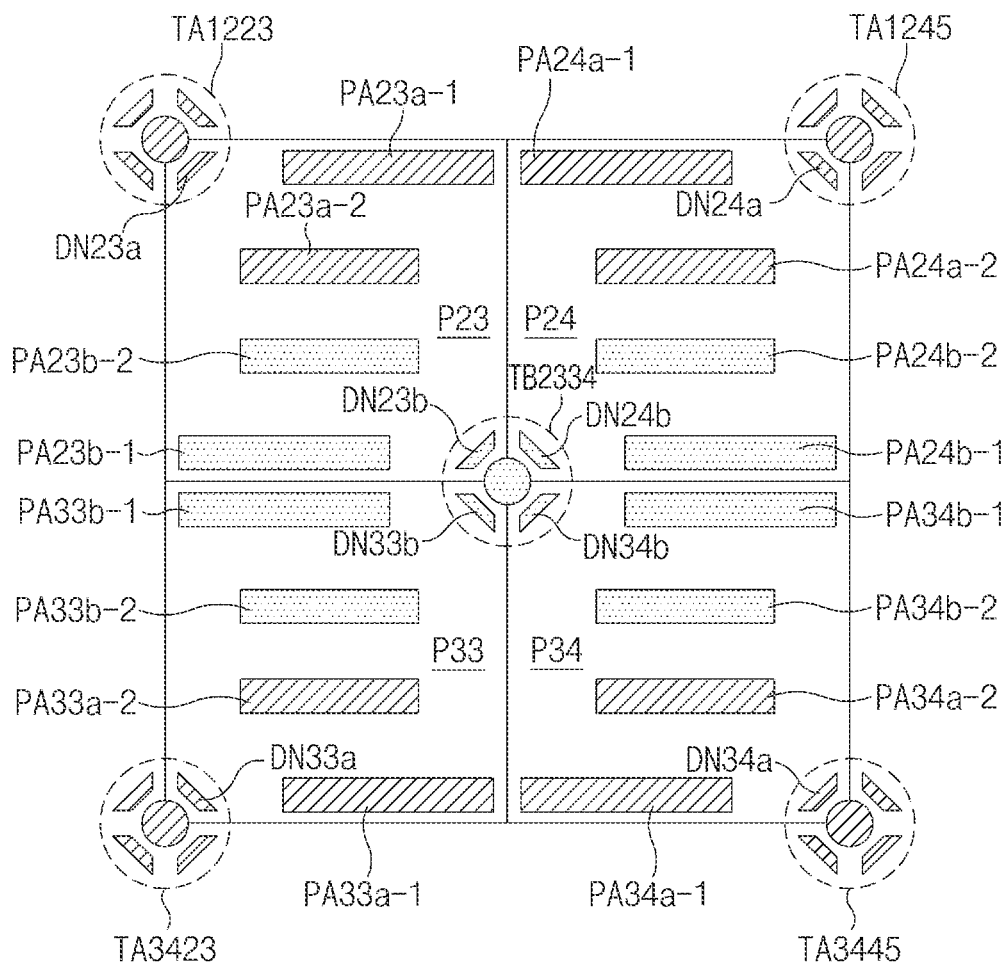
FIG. 18 illustrates another example of the pixel transistor region disposed on the pixel array illustrated in FIG. 2.

FIG. 18 illustrates another example of the pixel transistor region disposed on the pixel array illustrated in FIG. 2.

In FIG. 18, the pixels P23, P24, P33 and P34 will be taken as an example for description. However, the other pixels may also have substantially the same structure. Since the structures and functions of the respective pixels are substantially the same as those of the pixels described with reference to FIG. 17 except some of the structures and functions, the overlapping descriptions will be omitted herein.

First, the pixel P23 may include a first pixel transistor region PA23a-1 and PA23a-2 and a second pixel transistor region PA23b-1 and PA23b-2.

The first pixel transistor region PA23a-1 and PA23a-2 may be extended in a horizontal direction at the top of the pixel P23.

The second pixel transistor region PA23b-1 and PA23b-2 may be extended in a horizontal direction at the bottom of the pixel P23.

In the pixel P23, the first pixel transistor region PA23a-1 and PA23a-2 and the second pixel transistor region PA23b-1 and PA23b-2 may be disposed symmetrically with respect to a horizontal line passing through the center of the pixel P23.

FIG. 18 illustrates that the first pixel transistor region PA23a-2 is disposed closer to the horizontal line than the first pixel transistor region PA23a-1, and the second pixel transistor region PA23b-2 is disposed closer to the horizontal line than the second pixel transistor region PA23b-1. However, the scope of the disclosed technology is not limited thereto.

In the pixels illustrated in FIG. 18, a pixel may have a symmetrical structure with an adjacent pixel based on the boundary with the adjacent pixel, like the pixels illustrated in FIG. 17.

Furthermore, a voltage stabilization region may be disposed at a vertex region where no tap is disposed. Alternatively, the voltage stabilization region may not be disposed at the vertex region where no tap is disposed, but be disposed at the boundary between pixels adjacent to each other.

Figure 19:
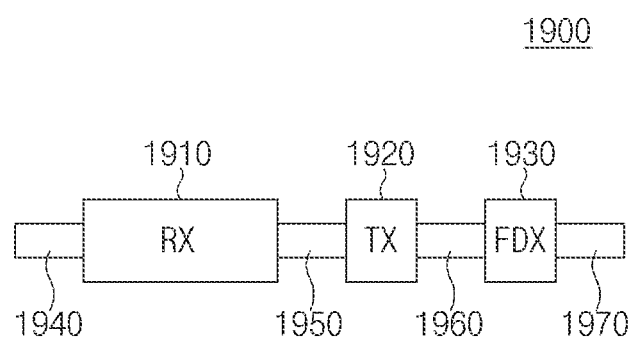
FIGS. 19 and 20 are diagrams illustrating examples of transistors included in first or second pixel transistor region of FIGS. 17 and 18.
Figure 20:
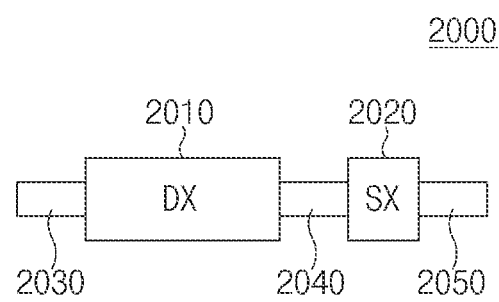

FIGS. 19 and 20 are diagrams illustrating transistors included in the first or second pixel transistor region of FIGS. 17 and 18.

Referring to FIG. 19, a pixel transistor region 1900 may correspond to a part of the first or second pixel transistor region (for example, PA23a-1 or PA23b-1) illustrated in FIGS. 17 and 18.

The pixel transistor region 1900 may include a reset transistor, a transmission transistor and a floating diffusion transistor. The reset transistor, the transmission transistor and the floating diffusion transistor may be coupled in series, and referred to as a first transistor group. The reset transistor, the transmission transistor and the floating diffusion transistor may correspond to the reset transistors RX_A and RX_B, the transmission transistors TX_A and TX_B and the floating diffusion transistors FDX_A and FDX_B, which are described with reference to FIG. 3.

A gate 1910 of the reset transistor may receive the reset signal RST, and a first terminal 1940 of the reset transistor may be supplied with the pixel voltage Vpx. According to an embodiment, the pixel voltage Vpx may be supplied from a metal wiring region on a substrate. The metal wiring region may be a region where signal lines for supplying voltages required for the operations of the pixels, signal lines for transferring signals outputted from the respective pixels, and connection lines for connecting internal components of the respective pixels are disposed. A second terminal of the reset transistor and a first terminal of the transmission transistor may form one terminal 1950, and the terminal 1950 may be coupled to a first or second detection node (for example, DN23a or DN23b).

A gate 1920 of the transmission transistor may receive the transmission signal TRG, and a terminal 1960 formed by a second terminal of the transmission transistor and a first terminal of the floating diffusion transistor may be coupled to a first capacitor (C1_A or C1_B of FIG. 3) and a gate of the drive transistor (2010 of FIG. 20). According to an embodiment, the terminal 1960 may indicate the floating diffusion node itself.

A gate 1930 of the floating diffusion transistor may receive the floating diffusion signal FDG, and a second terminal 1970 of the floating diffusion transistor may be coupled to a second capacitor (C2_A or C2_B of FIG. 3). In the present disclosure, it is described that the first transistor group includes the floating diffusion transistor. According to another embodiment, however, the floating diffusion transistor may be omitted. In this case, the second capacitor described with reference to FIG. 3 may also be omitted.

Referring to FIG. 20, a pixel transistor region 2000 may correspond to a part of the first or second pixel transistor region (for example, PA23a-2 or PA23b-2) illustrated in FIGS. 17 and 18.

The pixel transistor region 2000 may include a drive transistor and a selection transistor. The driver transistor and the selection transistor may be coupled in series, and referred to as a second transistor group. The drive transistor and the selection transistor may correspond to the drive transistors DX_A and DX_B and the selection transistors SX_A and SX_B which are described with reference to FIG. 3.

A gate 2010 of the drive transistor may be coupled to the terminal 1960, and a first terminal 2030 of the drive transistor may be supplied with the pixel voltage Vpx. A second terminal of the drive transistor and a first terminal of the selection transistor may form one terminal 2040.

A gate 2020 of the selection transistor may receive the selection signal SEL, and a second terminal 2050 of the selection transistor may be coupled to a vertical signal line (SL_A or SL_B of FIG. 3).

The first and second transistor groups may be disposed in such a manner that the first terminal 1940 of the reset transistor and the first terminal 2030 of the drive transistor, to which the same voltage is applied, are integrated with each other, and thus formed as one transistor group.

When the first and second transistor groups illustrated in FIGS. 19 and 20 are disposed in the first or second pixel transistor region illustrated in FIG. 17 or 18, the first and second transistor groups may be disposed to satisfy the symmetry described with reference to FIGS. 17 and 18.

For example, the first transistor groups included in the first pixel transistor regions PA23a-1 and PA24a-1 may be disposed so that the first terminal 1940 of the reset transistor is close to the second vertex region of the pixel P23, and the first transistor groups included in the first pixel transistor regions PA33a-1 and PA34a-1 may be disposed so that the first terminal 1940 of the reset transistor is close to the fourth vertex region of the pixel P33.

Furthermore, the second transistor groups included in the first pixel transistor regions PA23a-2 and PA24a-2 may be disposed so that the first terminal 2030 of the drive transistor is close to the second vertex region of the pixel P23, and the second transistor groups included in the first pixel transistor regions PA33a-2 and PA34a-2 may be disposed so that the first terminal 2030 of the drive transistor is close to the fourth vertex region of the pixel P33.

While various specific embodiments have been described above as examples only and variations of the disclosed embodiments and other embodiments can be made based on what is disclosed and illustrated in this patent document.

What is claimed is:

1. An image sensing device, comprising:
   a pixel array including pixels, each pixel structured to respond to incident light to produce photocharges indicative of detected incident light,
   wherein the pixel array includes:
   a first detection structure and a second detection structure located at vertex regions of the pixel on two opposite sides of the pixel in a diagonal direction of the pixel and configured to receive photocharges generated by the pixel in response to incident light and are carried by a current.

2. The image sensing device of claim 1, wherein first detection structures and second detection structure are alternately disposed in the diagonal direction in the pixel array.

3. The image sensing device of claim 2, wherein the first detection structures are arranged at first vertex regions of the pixels, the first vertex regions being non-consecutive along a row direction of the pixel array, or
   wherein the second detection structures are arranged at second vertex regions of the pixels, the second vertex regions being non-consecutive along the row direction of the pixel array.

4. The image sensing device of claim 2, wherein the first detection structures are arranged at first vertex regions of the pixels, the first vertex regions being non-consecutive along a column direction of the pixel array, or
   wherein the second detection structures are arranged at second vertex regions of the pixel, the second vertex regions being non-consecutive along the column direction of the pixel array.

5. The image sensing device of claim 1, further comprising a grid structure extending along a boundary between adjacent pixels included in the pixel array and configured to reflect or absorb the incident light.

6. The image sensing device of claim 5, wherein a width of the grid structure in a region extending along the boundary between the adjacent pixels is larger than a horizontal length and a vertical length of the first detection structure or the second detection structure.

7. The image sensing device of claim 5, wherein a width of the grid structure in a region extending along the boundary between the adjacent pixels is smaller than a horizontal length and a vertical length of the first detection structure or the second detection structure.

8. The image sensing device of claim 7, wherein the grid structure comprises one or more of a first guard region having a shape and area corresponding to the first detection structure and a second guard region having a shape and area corresponding to the second detection structure.

9. The image sensing device of claim 1, wherein the first detection structure and the second detection structure that are included in a first pixel of the pixel array are arranged in a first diagonal direction, and the first detection structure and the second detection structure that are included in a second pixel adjacent to the first pixel are arranged in a second diagonal direction different from the first diagonal direction.

10. The image sensing device of claim 1, wherein the first detection structure comprises a first control node configured to receive a first control signal and a plurality of first detection nodes disposed adjacent to the first control node, and
    the second detection structure comprises a second control node configured to receive a second control signal and a plurality of second detection nodes disposed adjacent to the second control node.

11. The image sensing device of claim 10, wherein each of the first and second control nodes has a circular shape, and
    each of the first detection nodes and the second detection nodes has a trapezoidal shape, a rectangular shape, a triangular shape, or an L-shape.

12. The image sensing device of claim 10, wherein each of the first and second control nodes has a cross shape, and
    each of the first detection nodes and the second detection nodes has a triangular shape or a rectangular shape.

13. The image sensing device of claim 10, wherein the first control signal has a same phase as a light signal for generating the incident light, and
    the second control signal has a phase difference of 180 degrees from the light signal.

14. The image sensing device of claim 10, wherein the pixel array includes first to fourth pixels that are arranged in a 2×2 array such that the second detection structure is disposed in the center of the 2×2 array,
    wherein the first control signal of the first detection structure of the first pixel has a same phase as a light signal for generating the incident light,
    the first control signal of the first detection structure of the second pixel has a phase difference of 180 degrees from the light signal,
    the first control signal of the first detection structure of the third pixel has a phase difference of 90 degrees from the light signal, and
    the first control signal of the first detection structure of the fourth pixel has a phase difference of 270 degrees from the light signal.

15. The image sensing device of claim 10, wherein each pixel of the pixel array comprises a first pixel transistor region including transistors for processing the photocharge captured by the first detection node and a second pixel transistor region including transistors for processing the photocharge captured by the second detection node,
    wherein the first pixel transistor region and the second pixel transistor region are disposed symmetrically with each other in each pixel.

16. The image sensing device of claim 15, wherein the first pixel transistor region and the second pixel transistor region of adjacent pixels are disposed symmetrically with respect to a boundary between the adjacent pixels.

17. An image sensing device, comprising:
pixels disposed in a substrate and arranged in a 2×2 matrix as a unit, each pixel structured to respond to incident light to produce photocharges indicative of detected incident light;
a control node disposed in a center of the pixels and configured to receive a control signal for generating a current in the substrate; and
a plurality of detection nodes disposed in the respective pixels, and configured to receive photocharges generated by the pixels in response to incident light and carried by the current.

18. The image sensing device of claim 17, wherein each detection node has a first side and a second side opposite to the first side and having a longer length than a length of the first side.

19. The image sensing device of claim 18, wherein a distance between the second side and the control node is longer than a distance between the first side and the control node.

* * * * *